US012607682B2

(12) United States Patent
Liu et al.

(10) Patent No.:  US 12,607,682 B2
(45) Date of Patent:  Apr. 21, 2026

(54) METHOD AND APPARATUS FOR DETERMINING STATE OF CHARGE AND BATTERY MANAGEMENT SYSTEM

(71) Applicant: BYD COMPANY LIMITED, Shenzhen (CN)

(72) Inventors: Sijia Liu, Shenzhen (CN); Tianyu Feng, Shenzhen (CN); Linwang Deng, Shenzhen (CN); Xiaoqian Li, Shenzhen (CN); Xun Song, Shenzhen (CN)

(73) Assignee: BYD COMPANY LIMITED, Shenzhen (CN)

( * ) Notice: Subject to any disclaimer, the term of this patent is extended or adjusted under 35 U.S.C. 154(b) by 876 days.

(21) Appl. No.: 17/915,308

(22) PCT Filed: Mar. 15, 2021

(86) PCT No.: PCT/CN2021/080767
§ 371 (c)(1),
(2) Date: Sep. 28, 2022

(87) PCT Pub. No.: WO2021/197038
PCT Pub. Date: Oct. 7, 2021

(65) Prior Publication Data
US 2023/0152380 A1      May 18, 2023

(30) Foreign Application Priority Data

Mar. 31, 2020    (CN) .......................... 202010245899.9

(51) Int. Cl.
*G01R 31/3842*    (2019.01)
*G01R 31/36*    (2020.01)
(Continued)

(52) U.S. Cl.
CPC ..... *G01R 31/3842* (2019.01); *G01R 31/3648* (2013.01); *G01R 31/367* (2019.01); *G01R 31/396* (2019.01); *H01M 2010/4271* (2013.01)

(58) Field of Classification Search
CPC ............ G01R 31/3842; G01R 31/3648; G01R 31/367; G01R 31/396; G01R 31/374;
(Continued)

(56) References Cited

U.S. PATENT DOCUMENTS 10,664,562 B2 *  5/2020  Balasingam ....... G01R 31/3842
11,226,373 B2 *  1/2022  Sayegh ................ G01R 31/389
(Continued)

FOREIGN PATENT DOCUMENTS

CN      103293485 A     9/2013
CN      106019164 A     10/2016
(Continued)

OTHER PUBLICATIONS

English Translation of International Search Report from PCT/CN2021/080767 dated May 26, 2021 (3 pages).
(Continued)

*Primary Examiner* — Tung S Lau
(74) *Attorney, Agent, or Firm* — Calfee, Halter & Griswold LLP

(57)      ABSTRACT

The present disclosure relates to a method and apparatus for determining a state of charge (SOC) of a battery and a battery management system (BMS), so as to resolve a problem such as inaccurate estimation of the SOC. The method includes: acquiring state data of the battery, where the state data comprises current data and voltage data; determining each element parameter value in an equivalent circuit model of the battery based on the equivalent circuit model, error information, battery characteristic data, and the state data by using a recursive least square (RLS) prediction
(Continued)

State data of a battery is acquired, where the state data includes current data and voltage data — S11

Each element parameter value in an equivalent circuit model of the battery is determined based on the equivalent circuit model, error information, battery characteristic data, and the state data by using a recursive least square (RLS) prediction model — S12

An estimated value of an SOC of the battery is determined based on the element parameter value in the equivalent circuit model, the state data, and the battery characteristic data according to an observer technique — S13 model; and determining an estimated value of the SOC of the battery based on the element parameter value in the equivalent circuit model, the state data, and the battery characteristic data according to a technique of an observer.

8 Claims, 5 Drawing Sheets

(51) Int. Cl.
G01R 31/367 (2019.01)
G01R 31/396 (2019.01)
H01M 10/42 (2006.01)
(58) Field of Classification Search
CPC ...... H01M 2010/4271; B60L 2240/547; B60L 2240/549; B60L 2260/44; B60L 58/10; B60L 3/12; Y02E 60/10; Y02T 10/70
See application file for complete search history.

(56) References Cited

U.S. PATENT DOCUMENTS

| 2014/0214348 | A1 | 7/2014 | Sahinoglu et al. |
| 2014/0244225 | A1 | 8/2014 | Balasingam et al. |
| 2014/0278167 | A1* | 9/2014 | Frost ...................... B60L 58/12 |
| | | | 702/63 |
| 2015/0377974 | A1 | 12/2015 | Choi |
| 2020/0033416 | A1 | 1/2020 | Takegami |

FOREIGN PATENT DOCUMENTS

| CN | 106154168 A | 11/2016 |
| CN | 107064811 A | 8/2017 |
| CN | 108957347 A | 12/2018 |
| CN | 110208703 A | 9/2019 |
| CN | 110646737 A | 1/2020 |
| WO | 2018179562 A1 | 10/2018 |

OTHER PUBLICATIONS

Xiaoyu Li et al., "Co-estimation of capacity and state-of-charge for lithium-ion batteries in electric vehicles", Energy, 174, 33-44 (2019).

* cited by examiner

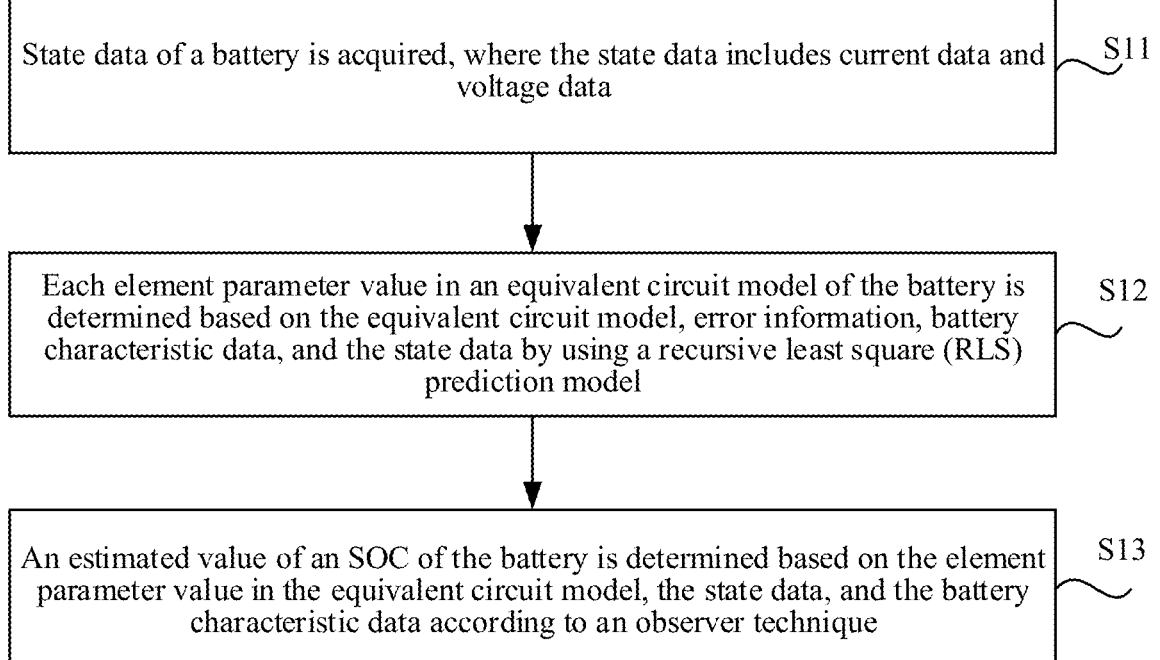

State data of a battery is acquired, where the state data includes current data and voltage data      S11

Each element parameter value in an equivalent circuit model of the battery is determined based on the equivalent circuit model, error information, battery characteristic data, and the state data by using a recursive least square (RLS) prediction model      S12

An estimated value of an SOC of the battery is determined based on the element parameter value in the equivalent circuit model, the state data, and the battery characteristic data according to an observer technique      S13

FIG. 1

| Initial attribute information of a battery is obtained based on an off-line test of the battery, where the initial attribute information includes an OCV-SOC curve and a hysteresis voltage-SOC curve of the battery | S21 |

| Multiple initial equivalent circuit models of different orders are established according to the initial attribute information | S22 |

| Calculation error information and calculation time information of the initial equivalent circuit model of each order under a target working condition is measured for the initial equivalent circuit model | S23 |

| A matching degree of each of the initial equivalent circuit models is calculated according to a number of parameters, the calculation error information, and the calculation time information of each corresponding initial equivalent circuit model | S24 |

| The initial equivalent circuit model having an optimal matching degree is determined as an equivalent circuit model of the battery | S25 |

FIG. 2

L RC networks

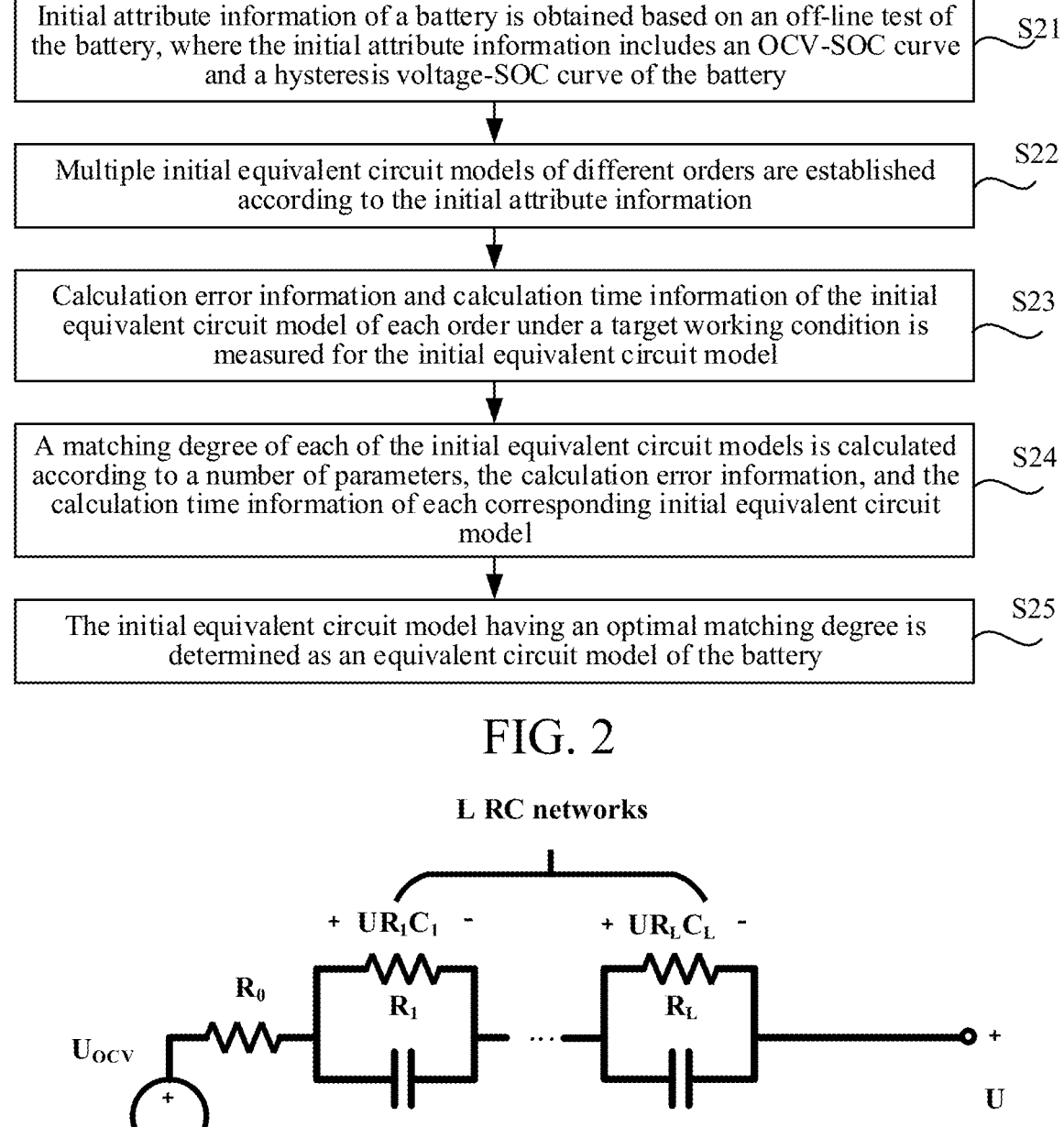

FIG. 3

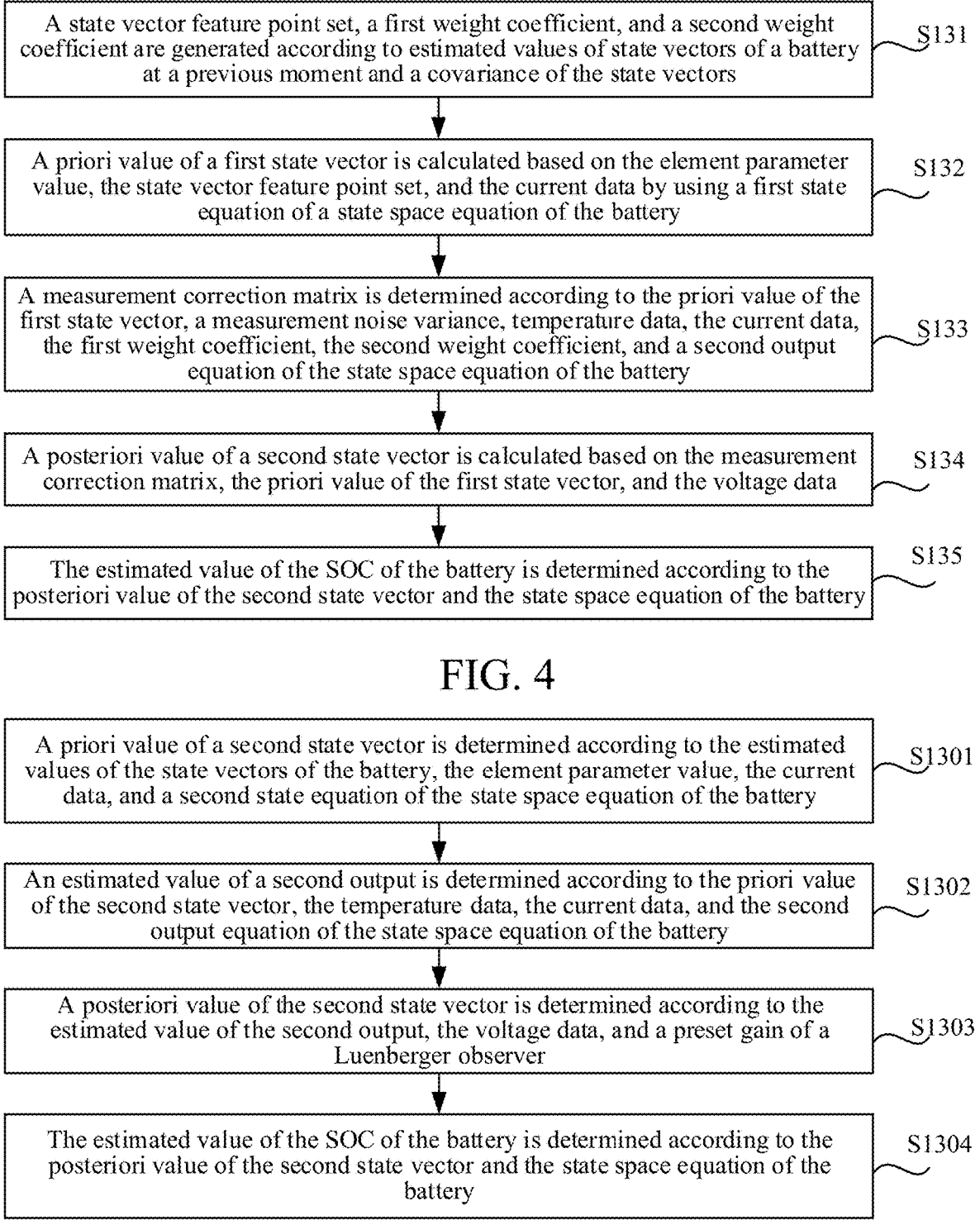

A state vector feature point set, a first weight coefficient, and a second weight coefficient are generated according to estimated values of state vectors of a battery at a previous moment and a covariance of the state vectors   S131

A priori value of a first state vector is calculated based on the element parameter value, the state vector feature point set, and the current data by using a first state equation of a state space equation of the battery   S132

A measurement correction matrix is determined according to the priori value of the first state vector, a measurement noise variance, temperature data, the current data, the first weight coefficient, the second weight coefficient, and a second output equation of the state space equation of the battery   S133

A posteriori value of a second state vector is calculated based on the measurement correction matrix, the priori value of the first state vector, and the voltage data   S134

The estimated value of the SOC of the battery is determined according to the posteriori value of the second state vector and the state space equation of the battery   S135

FIG. 4

A priori value of a second state vector is determined according to the estimated values of the state vectors of the battery, the element parameter value, the current data, and a second state equation of the state space equation of the battery   S1301

An estimated value of a second output is determined according to the priori value of the second state vector, the temperature data, the current data, and the second output equation of the state space equation of the battery   S1302

A posteriori value of the second state vector is determined according to the estimated value of the second output, the voltage data, and a preset gain of a Luenberger observer   S1303

The estimated value of the SOC of the battery is determined according to the posteriori value of the second state vector and the state space equation of the battery   S1304

FIG. 5

METHOD AND APPARATUS FOR DETERMINING STATE OF CHARGE AND BATTERY MANAGEMENT SYSTEM

CROSS-REFERENCE TO RELATED APPLICATIONS

The present disclosure is the National Stage of PCT International Application No. PCT/CN2021/080767, filed on Mar. 15, 2021, which claims priority to Chinese Patent Application No. 202010245899.9 filed on Mar. 31, 2020, which are incorporated herein by reference in their entireties.

FIELD

The present disclosure relates to the technical field of battery management, and more specifically, to a method and apparatus for determining a state of charge (SOC) and a battery management system (BMS).

BACKGROUND

As a new energy vehicle, an electric vehicle has advantages such as reducing oil consumption, low pollution, low noise, and the like, which is considered as an important solution to an energy crisis and environmental degradation. As a power source of the electric vehicle, an accurate estimation of a state of charge (SOC) not only can improve balance control efficiency of a battery system and energy management efficiency of the electric vehicle, but also is related to safety of the electric vehicle under a dynamic working condition.

In related arts, during the estimation of the SOC, measurement accuracy of battery data is difficult to be ensured due to unqualified calibration of a sampling element and aging of the sampling element, which easily leads to an error in an equivalent circuit model. In addition, impact of an error in the SOC on a parameter identification result is not considered, which leads to a mismatch between element parameter values and further reduces the accuracy of estimation of the SOC. This is not conducive to efficient management and reliable operation of a vehicle.

SUMMARY

The present disclosure provides a method and apparatus for determining a state of charge (SOC) and a battery management system (BMS), so as to resolve a problem of an inaccurate estimation of the SOC.

In order to achieve the above objective, a first aspect of the present disclosure provides a method for determining an SOC of a battery. The method includes:

acquiring state data of the battery, where the state data includes current data and voltage data;

determining each element parameter value in an equivalent circuit model of the battery based on the equivalent circuit model, error information, battery characteristic data, and the state data by using a recursive least square (RLS) prediction model; and determining an estimated value of the SOC of the battery based on the element parameter value in the equivalent circuit model, the state data, and the battery characteristic data according to a technique of an observer.

A second aspect of the present disclosure provides an apparatus for determining an SOC of a battery. The apparatus includes:

an acquisition module, configured to acquire state data of the battery, where the state data includes current data and voltage data;

a first determination module, configured to determine each element parameter value in an equivalent circuit model of the battery based on the equivalent circuit model, error information, battery characteristic data, and the state data by using an RLS prediction model; and a second determination module, configured to determine an estimated value of the SOC of the battery based on the element parameter value in the equivalent circuit model, the state data, and the battery characteristic data according to a technique of an observer.

A third aspect of the present disclosure provides a computer-readable storage medium, having a computer program stored thereon. When the program is executed by a processor, steps of the method according to any of the foregoing first aspect are performed.

A fourth aspect of the present disclosure provides an electronic device, including:

a memory, having a computer program stored thereon; and a processor, configured to execute the computer program in the memory to implement the steps of the method according to any of the foregoing first aspect.

A fifth aspect of the present disclosure provides a BMS, including the apparatus for determining an SOC according to any of the above.

Through the foregoing technical solutions, the present disclosure may achieve at least the following advantageous effects:

Each element parameter value in the equivalent circuit model is determined by using the RLS prediction model. In addition, in determining the element parameter value in the equivalent circuit model of the battery, the error information including at least a sampling error factor of the voltage data or a sampling error factor of the current data or the error information of the sampling error factor of the voltage data and the sampling error factor of the current data is further considered. Therefore, the impact of the sampling error may be reduced, accuracy of the element parameter value in the determined equivalent circuit model can be improved, and finally the accuracy of the determined equivalent circuit model of the battery can be improved. Further, the SOC value of the battery is determined based on the technique of the observer, so as to increase a matching degree of the element parameter value and the observer, and improve estimation accuracy of the SOC, thereby ensuring the efficient management and the reliable operation of the vehicle.

Other features and advantages of the present disclosure will be described in detail in the following detailed description part.

BRIEF DESCRIPTION OF THE DRAWINGS

The accompanying drawings are provided to further understand the present disclosure, and they constitute a part of the specification. The accompanying drawings, along with the specific implementations, are used to explain the present disclosure, and pose no limitation on the present disclosure. In the accompanying drawings:

FIG. 1 is a flowchart of a method for determining a state of charge (SOC) according to an exemplary embodiment of the present disclosure.

FIG. 2 is a flowchart of another method for determining an SOC according to an exemplary embodiment of the present disclosure.

FIG. 3 is a schematic diagram of an initial equivalent circuit of an L-order battery according to an exemplary embodiment of the present disclosure.

FIG. 4 is a flowchart of another method for determining an SOC according to an exemplary embodiment of the present disclosure.

FIG. 5 is a flowchart of another method for determining an SOC according to an exemplary embodiment of the present disclosure.

REFERENCE NUMERALS

Figure 6:
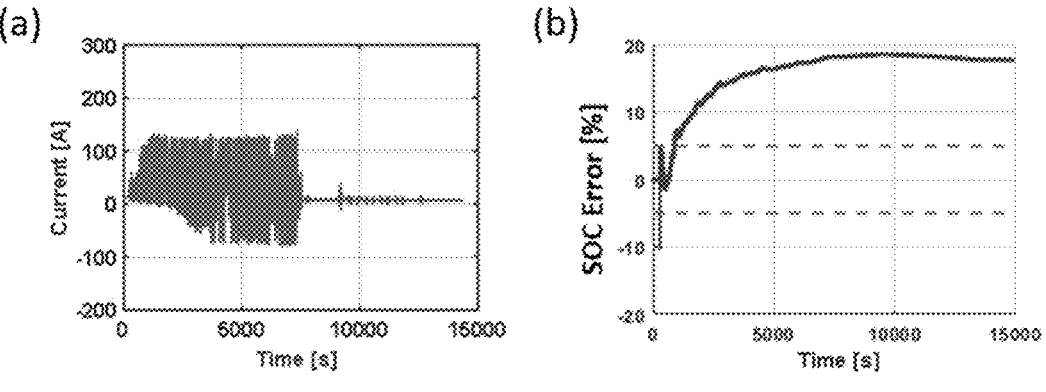
FIG. 6 is an effect diagram of a method for determining an SOC according to an exemplary embodiment of related arts.

Apparatus for determining SOC—800; Acquisition module—810; First determination module—820; Second determination module—830; Apparatus of equivalent circuit model—900; Processing assembly—902; Memory—904; Multimedia assembly—905; Power assembly—906; Input/output (I/O) interface—912; Sensor assembly—914; Communication assembly—916; Processor—920.

DETAILED DESCRIPTION

The following describes the specific implementations of the present disclosure in detail with reference to the accompanying drawings. It should be understood that the specific implementations described herein are merely used to describe and explain the present disclosure, but are not intended to limit the present disclosure.

It should be noted that, in the specification, claims, and accompanying drawings of the present disclosure, the terms "first", "second", and so on are intended to distinguish between similar objects but are not necessarily understood as describing a specific order or sequence.

Before a method and apparatus for determining a state of charge (SOC), a storage medium, and an electronic device provided in the present disclosure are described, application scenarios of embodiments of the present disclosure are first described. The embodiments of the present disclosure may be used for determining the SOC. The battery may be, for example, a ternary lithium battery, a lithium iron phosphate battery, and the like.

An electric vehicle is used as an example. As a power source of the electric vehicle, an accurate estimation of a state of charge of the battery not only can improve balance control efficiency of a battery system and energy management efficiency of the electric vehicle, but also is related to safety of the electric vehicle under a dynamic working condition. In related arts, the state of the battery may be analyzed by determining a corresponding equivalent circuit model. These states may be, for example, a state of charge (SOC for short), a state of energy (SOE for short), a state of power (SOP for short), a state of health (SOH for short), and the like.

The applicant found that due to reasons such as unqualified calibration of a sampling element, aging of the sampling element, and the like, measurement results of battery data may further include a corresponding error. As a result, the equivalent circuit model identified in related arts is prone to an error, which in turn leads to an error in estimation of the battery state. This is not conducive to safe operation and efficient management of a vehicle. For example, with use of the electric vehicle, a sampling device of a battery management system (BMS) continues to age, and a measurement bias of the BMS appears again, causing a measurement noise of the BMS to be a colored noise instead of a white noise. Eventually, the error in the identified equivalent circuit model occurs, and estimation accuracy of the battery state is reduced. In addition, the impact of the SOC error on a parameter identification result is not considered, resulting in a mismatch between each element parameter value and the SOC of the battery, which further reduces the estimation accuracy of the SOC.

The present disclosure provides a method for determining an SOC. Referring to a schematic flowchart of a method for determining an SOC of a battery shown in FIG. 1, the method includes the following steps.

S11: State data of the battery is acquired, where the state data includes current data and voltage data.

The state data may further include temperature data, capacity data, an open circuit voltage (OCV)-SOC curve, and the like of the battery.

An electric vehicle is used as an example. During specific implementation, the state data of the battery may be acquired directly by the BMS, or may be acquired indirectly by the BMS, or may be acquired directly and indirectly by the BMS. For example, the BMS may directly acquire the current data of the battery by using a current sensor. Alternatively, the BMS may acquire the temperature data of the battery by using a temperature sensor. In some embodiments, the BMS may also indirectly acquire the state data through a corresponding data interface, for example, may acquire OCV-SOC curve information of the battery stored in a memory through the data interface.

S12: Each element parameter value in an equivalent circuit model of the battery is determined based on the equivalent circuit model, error information, battery characteristic data, and the state data by using a recursive least square (RLS) prediction model.

The equivalent circuit model is obtained based on an off-line test performed on the battery, and an order of the equivalent circuit model may be obtained based on the off-line test performed on the battery, for example, a first-order equivalent circuit model, a second-order equivalent circuit model, and the like. The element parameter value may be used for representing a value of each element in the equivalent circuit model.

The error information may include a sampling error factor of the voltage data configured to describe a difference between the voltage data of the battery collected by the sampling element and true voltage data of the battery. For example, the voltage data $\tilde{U}(k)$ of the battery collected by the sampling element may be: $\tilde{U}(k)=U(k)+\varepsilon_1$, where $U(k)$ is a truth value of a voltage of the battery at a $k^{th}$ moment, and $\varepsilon_1$ is the sampling error factor of the voltage data.

In this way, in the above technical solutions, in determining the element parameter value in the equivalent circuit model of the battery, the sampling error factor of the voltage data is further considered. Therefore, the impact of the voltage sampling error can be reduced, accuracy of the element parameter value in the determined equivalent circuit model can be improved, and finally the accuracy of the determined equivalent circuit model can be improved.

Furthermore, in some embodiments, the error information may also include a sampling error factor of the current data configured to describe a difference between the current data of the battery collected by the sampling element and true current data of the battery. For example, the current data $\tilde{I}(k)$ of the battery collected by the sampling element may be: $\tilde{I}(k)=I(k)+\varepsilon_2$, where $I(k)$ is a truth value of a current of the battery at the $k^{th}$ moment, and $\varepsilon_2$ is the sampling error factor of the current data.

In this way, in the above technical solutions, in determining the element parameter value in the equivalent circuit model of the battery, the sampling error factor of the current data is further considered. Therefore, the impact of the current sampling error can be reduced, accuracy of the element parameter value in the determined equivalent circuit model can be improved, and finally the accuracy of the determined equivalent circuit model can be improved.

It should be noted that, in some embodiments, the error information may also include both the sampling error factor of the voltage data and the sampling error factor of the current data. In this case, step S12 includes:

determining the element parameter value in the equivalent circuit model of the battery based on the equivalent circuit model, the sampling error factor of the voltage data, the sampling error factor of the current data, and the state data by using an RLS prediction model.

According to the above technical solution, in determining the element parameter value in the equivalent circuit model of the battery, the sampling error factor of the voltage data and the sampling error factor of the current data are further considered. Therefore, the impact of the sampling error can be further reduced, accuracy of the element parameter value in the determined equivalent circuit model can be improved, and finally the accuracy of the determined equivalent circuit model can be improved.

It should be noted that, in some embodiments, the error information may further include a sampling time difference between the voltage data and the current data, and an error in the OCV of the battery. That is to say, during specific implementation, the sampling error may include one or more of the sampling error factor of the voltage data, the sampling error factor of the current data, the sampling time difference between the voltage data and the current data, or the error in the OCV of the battery, which is not limited in the present disclosure.

In a possible implementation, referring to a flowchart for determining an equivalent circuit model shown in FIG. 2, as shown in the figure, in step S21, initial attribute information of the battery is obtained based on an off-line test of a battery, where the initial attribute information includes an OCV-SOC curve and a hysteresis voltage-SOC curve of the battery.

The initial attribute information may further include battery capacity information, an initial covariance value of a battery model parameter, and the like. The off-line test may include a capacity test, a pulse test, and a typical working condition test.

In some embodiments, for the capacity test, in one embodiment, the capacity test includes the following.

(1) A temperature is adjusted to 25° C., a battery is discharged to a lower voltage limit at a capacity test current value recommended by a battery manufacturer (for example, 1 C), and the battery is allowed to stand for 30 minutes.

(2) After the battery is charged to an upper voltage limit (for example, 4.25V) at the capacity test current value recommended by the battery manufacturer (for example, 1 C), the battery is charged at a constant voltage (a constant voltage value may be a value suggested by the battery manufacturer, for example, 4.25V), and the battery is allowed to stand for 30 minutes.

(3) Capacity values accumulated in (1) and (2) are counted, the above (1) and (2) are performed, until a capacity value difference between adjacent cycles is less than 0.1 Ah, and the capacity value at this time is denoted as the battery capacity $Q_m$.

According to some embodiments of the present disclosure, after the battery capacity $Q_m$ is obtained, the pulse test may be performed on the battery. The pulse test may include two parts: charging and discharging. The charging part and the discharging part each include 20 sets of pulse combination sequences.

For example, in the first 18 sets of pulse combination sequences in the charging part, each set of pulse combination sequences may include the following.

(1) A temperature is adjusted to 25° C., and a constant-current charging pulse is applied (with an amplitude of 1 C), until an accumulative ampere-hour variation of the pulse is greater than or equal to 5% of $Q_m$.

(2) The battery is allowed to stand for two hours.

(3) A constant-current charging pulse is applied for 10 seconds (with an amplitude of 0.5 C).

(4) The battery is allowed to stand for 40 seconds.

(5) A constant-current discharging pulse is applied for 10 seconds (with an amplitude of 0.1 C).

(6) (3) to (5) are performed after 0.1 C is replaced with 0.5 C, 1 C, 2 C, 3 C, 4 C, and 5 C.

(7) The battery is allowed to stand for 24 hours.

(8) The temperature is adjusted to 55° C., and the battery is allowed to stand for 2 h.

(9) 55° C. is replaced with 40° C., 25° C., 10° C., 0° C., −10° C., −20° C., and −30° C. respectively, and (8) is performed.

(10) The temperature is adjusted to 25° C.

(11) The battery is allowed to stand for 24 hours.

In the last 2 sets of pulse combination sequences in the charging part, each set of pulses include the following.

(1) A constant-current and constant-voltage charging pulse is applied, until the accumulative ampere-hour variation of the pulse is greater than or equal to 5% of $Q_m$.

(2) The battery is allowed to stand for two hours.

(3) A constant-current charging pulse is applied for 10 seconds (with an amplitude of 0.5 C).

(4) The battery is allowed to stand for 40 seconds.

(5) A constant-current discharging pulse is applied for 10 seconds (with an amplitude of 0.5 C).

(6) (3) to (5) are performed after 0.5 C is replaced with 1 C, 2 C, 3 C, 4 C, and 5 C respectively.

(7) The battery is allowed to stand for 24 hours.

(8) The temperature is adjusted to 55° C., and the battery is allowed to stand for 2 h.

(9) 55° C. is replaced with 40° C., 25° C., 10° C., 0° C., −10° C., −20° C., and −30° C. respectively, and (8) is performed.

(10) The temperature is adjusted to 25° C.

(11) The battery is allowed to stand for 24 hours.

In addition, for the discharging part, in the 20 sets of pulse combination sequences of the discharging part, each set of pulses may include the following.

(1) A constant-current discharging pulse is applied (with an amplitude of 1 C), until an accumulative ampere-hour variation of the pulse is greater than or equal to 5% of $Q_m$.

(2) The battery is allowed to stand for two hours.

(3) A constant-current discharging pulse is applied for 10 seconds (with an amplitude of 0.5 C).

(4) The battery is allowed to stand for 40 seconds.

(5) A constant-current charging pulse is applied for 10 seconds (with an amplitude of 0.5 C).

(6) (3) to (5) are performed after 0.5 C is replaced with 1 C, 2 C, 3 C, 4 C, and 5 C respectively.

(7) The battery is allowed to stand for 24 hours.

(8) The temperature is adjusted to 55° C., and the battery is allowed to stand for 2 h.

(9) 55° C. is replaced with 40° C., 25° C., 10° C., 0° C., −10° C., −20° C., and −30° C. respectively, and (8) is performed.

(10) The temperature is adjusted to 25° C.

(11) The battery is allowed to stand for 24 hours.

In this way, through the above pulse test, a variation curve of the battery charging OCV with the SOC of the battery under different SOCs of the battery and different temperature conditions may be obtained according to the voltage of the battery after being allowed to stand for 2 h in step (8) in each set of pulses in the charging part. Similarly, a variation curve of the battery discharging OCV with the SOC of the battery under different SOCs of the battery and different temperature conditions may be obtained according to the voltage of the battery after being allowed to stand for 2 h in step (8) in each set of pulses in the discharging part. Under a condition of the same SOC, an average value of the battery charging OCV and the discharging OCV is the OCV of the battery, and ½ of a difference between the charging OCV and the discharging OCV is denoted as a hysteresis voltage. The variation curve of the OCV of the battery with the SOC of the battery and the temperature is an OCV-SOC curve of the battery, and a variation curve of the hysteresis voltage with the SOC of the battery and the temperature is a hysteresis voltage-SOC curve.

In this way, in step S22, multiple initial equivalent circuit models of different orders may be established according to the initial attribute information.

For example, an L-order initial equivalent circuit model established according to the initial attribute information is shown in FIG. 3. $U_{OCV}$ and $U_{hys}$ respectively represent the OCV of the battery and a battery hysteresis voltage, I and U respectively represent the battery current (which is positive during discharging) and the battery voltage, $R_0$ is an ohmic resistance in the battery circuit model, $R_1$~$R_L$ are polarization resistances corresponding to RC networks 1-L, $R_1$~$R_L$ are polarization capacitances corresponding to the RC networks 1-L, and $U_{R_1C_1}$~$R_{R_LC_L}$ are terminal voltages of an energy storage element.

During specific implementation, for the initial equivalent circuit model of each order, a value of each element parameter in the initial equivalent circuit model of the order is determined by using a multi-objective optimization algorithm. A particle swarm algorithm is used as an example. The value of each element parameter may be randomly initialized, and a voltage prediction residual root mean square of the equivalent circuit model of the order under the typical working condition is used as an adaptive value. Through continuous iterative optimization, the initial parameter value (an optimization condition may be that the voltage prediction residual root mean square of the equivalent circuit model of the order under the typical working condition is less than a preset threshold, a number of iterations reaches the threshold, or the like) of the element of the equivalent circuit model of the order is selected, and the initial equivalent circuit models of various orders are finally obtained. In addition, in some embodiments, in order to reduce complexity of the model, an order of the equivalent circuit model may further be limited. For example, the order L of the equivalent circuit model may be limited to L≤3, where L is a positive integer.

In step S23, for the initial equivalent circuit model of each order, calculation error information and calculation time information of the initial equivalent circuit model under a target working condition are tested.

Carrying on with the previous embodiment, after the initial equivalent circuit models of the orders, the calculation error information and the calculation time information of the initial equivalent circuit model of each order under the typical working condition may be tested respectively.

In this way, in step S24, a matching degree of each of the initial equivalent circuit models may be calculated according to a number of parameters, the calculation error information, and the calculation time information of each corresponding initial equivalent circuit model. In step S25, the initial equivalent circuit model having an optimal matching degree is determined as the equivalent circuit model of the battery.

By adopting the above technical solution, the initial attribute information of the battery is obtained by performing the off-line test on the battery. According to some embodiments of the present disclosure, a matching degree of the initial equivalent circuit models of different orders is established and calculated according to the initial attribute information, thereby enhancing the accuracy of the equivalent circuit model.

According to some embodiments of the present disclosure, the equivalent circuit model is an RC circuit model. Step S11 includes:

acquiring the state data collected by a BMS, where the state data further includes temperature data of the battery and SOC data of the battery.

For example, the BMS may directly acquire the current data of the battery by using a current sensor. Alternatively, the BMS may acquire the temperature data of the battery by using a temperature sensor. In some embodiments, the BMS may also indirectly acquire the state data through a corresponding data interface. For example, the OCV-SOC curve information and the hysteresis voltage-SOC curve information of the battery stored in the memory are acquired through the data interface.

Step S12 includes:

determining, according to the SOC data, a target OCV and a target hysteresis voltage from the OCV-SOC curve and the hysteresis voltage-SOC curve of the battery that correspond to the temperature data.

It should be understood that, after the OCV-SOC curve and the hysteresis voltage-SOC curve of the battery under different temperatures are acquired through the off-line test, the target OCV and the target hysteresis voltage at a current moment may be determined according to current SOC information of the battery, the OCV-SOC curve, and the hysteresis voltage-SOC curve acquired by the BMS.

In step S12, the element parameter value of the equivalent circuit model of the battery may be determined based on the equivalent circuit model, the error information, the current data, the voltage data, the target OCV, and the target hysteresis voltage by using the RLS prediction model. In this way, the effect of on-line identification of the battery model parameter value of the battery is achieved. In addition, since the sampling error of the sampling device of the BMS is also considered during the identification, the accuracy of the element parameter value in the determined equivalent circuit model can be further improved, and the accuracy of the equivalent circuit model can be further improved.

The error information includes at least one of a sampling error factor of the voltage data, a sampling error factor of the current data, a sampling time difference between the voltage data and the current data, or an error in the OCV of the battery.

According to some embodiments of the present disclosure, the error information includes a sampling error factor of the voltage data and a sampling error factor of the current data, and an identification form of the RLS prediction model is:

$$\begin{cases} \tilde{Y}(k) = U_{OCV}(k) + U_{hys}(k) - \tilde{U}(k) \\ \varphi(k) = \left[ \tilde{Y}(k-1) \sim \tilde{Y}(k-L),\, 1,\, \tilde{I}(k-1) \sim \tilde{I}(k-L) \right] \\ \theta(k) = \left[ a_1 \sim a_L,\, a_0,\, b_0 \sim b_L \right]^T \\ \tilde{Y}(k) = \varphi(k) \cdot \theta(k) \end{cases}$$

where $\tilde{Y}(k)$ is a measured value of an output signal of the RLS prediction model at a $k^{th}$ moment, $U_{OCV}(k)$ and $U_{hys}(k)$ respectively represent a target OCV and a target hysteresis voltage of the battery at the $k^{th}$ moment, $\tilde{U}(k)$ is a battery voltage value collected by the BMS at the $k^{th}$ moment, $\varphi(k)$ is an input signal of the RLS prediction model at the $k^{th}$ moment, $\tilde{I}(k)$ is a battery current value collected by the BMS at the $k^{th}$ moment, $\theta(k)$ is a parameter matrix of the RLS prediction model at the $k^{th}$ moment, $a_1 \sim a_L$, $a_0$, $b_0 \sim b_L$ are parameters in the parameter matrix, L is an order of the initial equivalent circuit model, and T is a sampling period of the BMS.

$\tilde{U}(k) = U(k) + \varepsilon_1$, where $U(k)$ is a truth value of a voltage of the battery at the $k^{th}$ moment, and $\varepsilon_1$ is a sampling error factor of the voltage data. $\tilde{I}(k) = I(k) + \varepsilon_2$, where $I(k)$ is a truth value of a current of the battery at the $k^{th}$ moment, and $\varepsilon_2$ is a sampling error factor of the current data.

FIG. 3 is used as an example for description. A general expression of the initial equivalent circuit of the L-order battery in a Laplace space may be obtained according to the L-order initial equivalent circuit model shown in FIG. 3:

$$\frac{U_{OCV}(s) + U_{hys}(s) - U(s)}{I(s)} = R_0 + \sum_{i=1}^{L} \frac{R_i}{1 + s \cdot R_i \cdot C_i} \tag{1}$$

where $U_s$ is battery voltage data collected by the BMS, $I_s$ is a truth value of the battery current sampled synchronously with the voltage, $U_{OCV}$ is the OCV of the battery, $U_{hys}$ is the hysteresis voltage of the battery, $R_0$ represents an ohmic resistance of the equivalent circuit model, $R_1 \sim R_L$ are polarization resistances corresponding to RC networks 1-L, and $C_1 \sim C_L$ are polarization capacitances corresponding to the RC networks 1-L.

Bilinear transformation is performed on $$S = \frac{2}{T} \cdot \frac{1 - z^{-1}}{1 + z^{-1}}.$$

Let $Y(z) = U_{OCV}(z) + U_{hys}(z) - U(z)$ to obtain:

$$\frac{Y(z)}{I(z)} = R_0 + \sum_{i=1}^{L} \frac{\dfrac{T \cdot R_i}{T + 2 \cdot R_i \cdot C_i} + \dfrac{T \cdot R_i}{T + 2 \cdot R_i \cdot C_i} \cdot z^{-1}}{1 + \dfrac{T - 2 \cdot R_i \cdot C_i}{T + 2 \cdot R_i \cdot C_i} \cdot z^{-1}} \tag{2}$$

where T is a sampling period of the BMS.

A definition is:

$$\begin{cases} \zeta_i = \dfrac{T \cdot R_i}{T + 2 \cdot R_i \cdot C_i}, & i = 1 \sim L \\ \xi_i = \dfrac{T - 2 \cdot R_i \cdot C_i}{T + 2 \cdot R_i \cdot C_i}, & i = 1 \sim L \end{cases} \tag{3}$$

Equation (2) may be further simplified as Equation (4):

$$\frac{Y(z)}{I(z)} = \frac{\sum_{k=0}^{L} b_i \cdot z^{-i}}{1 - \sum_{j=0}^{L} a_j \cdot z^{-j}} \tag{4}$$

where $b_i$ and $a_j$ are simplified coefficients (i=0~L, j=1~$L_i$), and an expression is determined by a model order L of the battery, as shown in Equations (5)-(7).

When L=1, the expression is shown in Equation (5):

$$\begin{cases} b_0 = R_0 + \zeta_1 \\ b_1 = R_0 \cdot \xi_1 + \zeta_1 \\ a_1 = -\zeta_1 \end{cases} \tag{5}$$

When L=2, the expression is shown in Equation (6):

$$\begin{cases} b_0 = R_0 + \zeta_1 + \zeta_2 \\ b_1 = \zeta_1 + \zeta_2 + \zeta_1 \cdot \xi_2 + \zeta_2 \cdot \xi_1 + R_0 \cdot \xi_1 + R_0 \cdot \xi_2 \\ b_2 = \zeta_1 \cdot \xi_2 + \zeta_2 \cdot \xi_1 + R_0 \cdot \xi_1 \cdot \xi_2 \\ a_1 = \xi_1 - \xi_2 \\ a_2 = -\xi_1 \cdot \xi_2 \end{cases} \tag{6}$$

When L=3, the expression is shown in Equation (7):

$$\begin{cases} b_0 = R_0 + \zeta_1 + \zeta_2 + \zeta_3 \\ b_1 = \zeta_1 + \zeta_2 + \zeta_3 + \zeta_1 \cdot \xi_2 + \zeta_1 \cdot \xi_3 + \zeta_2 \cdot \xi_1 + \zeta_2 \cdot \xi_3 + \\ \quad \zeta_3 \cdot \xi_1 + \zeta_3 \cdot \xi_2 + R_0 \cdot \xi_1 + R_0 \cdot \xi_2 + R_0 \cdot \xi_3 \\ b_2 = \zeta_1 \cdot \xi_2 + \zeta_1 \cdot \xi_3 + \zeta_2 \cdot \xi_1 + \zeta_2 \cdot \xi_3 + \zeta_3 \cdot \xi_1 + \zeta_3 \cdot \xi_2 + \\ \quad \zeta_1 \cdot \xi_2 \cdot \xi_3 + \zeta_2 \cdot \xi_1 \cdot \xi_3 + \zeta_3 \cdot \xi_1 \cdot \xi_2 + R_0 \cdot \xi_1 \cdot \xi_2 + \\ \quad R_0 \cdot \xi_1 \cdot \xi_2 + R_0 \cdot \xi_1 \cdot \xi_3 + R_0 \cdot \xi_2 \cdot \xi_3 \\ b_3 = \zeta_1 \cdot \xi_2 \cdot \xi_3 + \zeta_2 \cdot \xi_1 \cdot \xi_3 + \zeta_3 \cdot \xi_1 \cdot \xi_2 + R_0 \cdot \xi_1 \cdot \xi_2 \cdot \xi_3 \\ a_1 = -\xi_1 - \xi_2 - \xi_3 \\ a_2 = -\xi_1 \cdot \xi_2 - \xi_1 \cdot \xi_3 - \xi_2 \cdot \xi_3 \\ a_3 = -\xi_1 \cdot \xi_2 \cdot \xi_2 \end{cases} \tag{7}$$

A discretized expression form of the equivalent circuit model may be obtained from Equation (4), as shown in Equation (8):

$$Y(k) = \sum_{j=1}^{L} a_j \cdot Y(k-j) + \sum_{i=0}^{L} b_i \cdot I(k-1) \tag{8}$$

Further, in some embodiments, since an onboard BMS measurement error is colored noise, the following two types of errors may further be considered:

(1) A measurement error of the voltage data: $\tilde{U}(k) = U(k) + \varepsilon_1$ (9)

(2) A measurement error of the current data: $\tilde{I}(k) = I(k) + \varepsilon_2$ (10)

where $\tilde{U}(k)$ and $\tilde{I}(k)$ respectively represent a battery voltage measurement and a battery current measurement recorded by the BMS, $\varepsilon_1$ is the sampling error factor of the voltage data, and $\varepsilon_2$ is the sampling error factor of the current data.

According to Equation (9) and Equation (10), $\tilde{Y}=U_{OCV}(k)+U_{hys}(k)-\tilde{U}(k)$ is obtained under an onboard environment. It should be understood that when the SOC of the battery is known, $U_{OCV}(k)$ and $U_{hys}(k)$ are respectively obtained according to the OCV-SOC curve and the hysteresis voltage-SOC curve, which may also be used as known quantities. Then in combination with Equation (8), the following equation may be obtained:

$$\tilde{Y}(k) = \tag{11}$$
$$\sum_{j=1}^{L} a_j \cdot \tilde{Y}(k-1) + [(1 - \sum_{j=1}^{L} a_j) \cdot (-\varepsilon_1) - \sum_{i=0}^{L} b_i \cdot \varepsilon_2] + \sum_{i=0}^{L} b_j \cdot \tilde{I}(k-i)$$

A definition is:

$$a_0 = (1 - \sum_{j=1}^{L} a_j) \cdot (-\varepsilon_1) - \sum_{i=0}^{L} b_i \cdot \varepsilon_2,$$

and the identification form of the RLS prediction model in the present disclosure is:

$$\begin{cases} \varphi(k) = [\tilde{Y}(k-1) \sim \tilde{Y}(k-L), 1, \tilde{I}(k) \sim \tilde{I}(k-L)] \\ \theta(k) = [a_1 \sim a_L, a_0, b_0 \sim b_L]^T \end{cases} \tag{12}$$

Then $\tilde{Y}(k)=\varphi(k) \cdot \theta(k)$, and then the parameter $\theta(k)$ may be estimated by using the RLS method. As shown in Equation (13), $P(k)$ represents a covariance at the $k^{th}$ moment calculated by using the RLS, $\lambda$ is a forgetting factor, a value of the forgetting factor may range from 0.95 to 1, and $\tilde{Y}(_k)$ is a measured value of an output $Y(k)$.

$$\begin{cases} K(k) = \dfrac{P(k-1) \cdot [\varphi(k)]^T}{\lambda + \varphi(k) \cdot P(k-1) \cdot [\varphi(k)]^T} \\ \theta(k) = \theta(k-1) + K(k) \cdot [\tilde{Y}(k) - \varphi(k) \cdot \theta(k-1)] \\ P(k) = \dfrac{1}{\lambda}[P(k-1) - K(k) \cdot \varphi(k) \cdot P(k-1)] \end{cases} \tag{13}$$

Then Equation (3) and Equations (5)-(7) are inversely solved by using a method for solving multivariate equations, so as to obtain the element parameter value $P_{parameter}=[R_0, R_1 \sim R_L, C_1 \cdot C_L]$ of the battery. For example, simultaneous equations 12 and 13 may be solved to obtain $\theta(k)$. In a case that $\theta(k)$ is known, Equation 3 and Equations 5-7 (determined according to the order of the battery model) may be inversely solved to obtain the element parameter value $P_{parameter}=[R_0, R_1 \sim R_L, C_1 \sim C_L]$ of the battery, and then the equivalent circuit model of the battery may be determined by substituting the element parameter value into the battery model parameter.

The applicant found that in some scenarios, the error information includes a sampling error factor of the voltage data, a sampling error factor of the current data, a sampling time difference between the voltage data and the current data, and an error in the OCV of the battery. The identification form of the RLS prediction model is:

$$\begin{cases} \tilde{Y}(k) = \tilde{U}_{OCV}(k) + U_{hys}(k) - \tilde{U}(k) \\ \varphi(k) = [\tilde{Y}(k-1) \sim \tilde{Y}(k-L), 1, \tilde{I}(k), \tilde{I}(k-1) \sim \tilde{I}(k-L), \tilde{I}(k-L-1)] \\ \theta(k) = [a_1 \sim a_L, a_0, c_1, d_0 \sim d_L, c_2]^T \\ \tilde{Y}(k) = \varphi(k) \cdot \theta(k) \end{cases}$$

where $\tilde{Y}(k)$ is a measured value of an output signal of the RLS prediction model at a $k^{th}$ moment, $U_{OCV}(k)$ and $U_{hys}(k)$ respectively represent a target OCV and a target hysteresis voltage of the battery at the $k^{th}$ moment, $\tilde{U}(k)$ is a battery voltage value collected by the BMS at the $k^{th}$ moment, $\varphi(k)$ is an input signal of the RLS prediction model at the $k^{th}$ moment, $\tilde{I}(k)$ is a battery current value collected by the BMS at the $k^{th}$ moment, $\theta(k)$ is a parameter matrix of the RLS prediction model at the $k^{th}$ moment, $a_1 \sim a_L$, $a_0$, $c_1$, $d_0 \sim d_L$, $c_2$ are parameters in the parameter matrix, L is an order of the initial equivalent circuit model, and T is a sampling period of the BMS.

$\tilde{U}(k)=U(k) \pm \varepsilon_1$, where $U(k)$ is a truth value of a voltage of the battery at the $k^{th}$ moment, and $\varepsilon_1$ is a sampling error factor of the voltage data. $\tilde{I}(k)=I(k+\varepsilon_3) \pm \varepsilon_2$, where I is a battery current sampled synchronously with the voltage, $\varepsilon_2$ is a sampling error factor of the current data, and $\varepsilon_3$ is a sampling time difference between the current data and the voltage data. $\tilde{U}_{OCV}(k)=U_{OCV}(k)+\varepsilon_4$, where $\tilde{U}_{OCV}$ and $\varepsilon_4$ respectively represent an error in an OCV value of the battery and an error in the corresponding OCV of the battery when an error exists in the SOC of the battery.

Carrying on with Equation (10) of the previous embodiment for description, in some scenarios, the following error may further be considered:

(3) a sampling time difference between the current data and the voltage data, that is, $\tilde{I}(k)=I'(k+\varepsilon_3)$ (14)

where $I'(k)=I(k)+\varepsilon_2$, I is a battery current sampled synchronously with the voltage, and $\varepsilon_3$ is a sampling time difference between the current data and the voltage data. With reference to Equation (10), definitions of $I(k)$ and $\varepsilon_2$ are not described in detail in the present disclosure.

In this way, a Taylor expansion is performed on Equation (14) to obtain Equation (15):

$$I'(k+\varepsilon_3) = I'(k) + \varepsilon_3 \cdot I'(k) \tag{15}$$

$$\text{If } I'(k) \approx \frac{\tilde{I}(k) - \tilde{I}(k-1)}{T},$$

Equation (15) may be transformed into:

$$\tilde{I}(k) \approx \tilde{I}(k) + \varepsilon_3 \cdot \frac{\tilde{I}(k) - \tilde{I}(k-1)}{T} \tag{16}$$

In addition, since a parameter value estimation process of the equivalent circuit model and the estimation process of the SOC of the battery are separated from each other, the impact of the SOC error of the battery may further be considered in the parameter value estimation process. That is to say, when an error exists in the SOC of the battery, the error in the OCV of the battery is required to be considered for the parameter estimation: $\tilde{U}_{OCV}(k)=U_{OCV}(k)+\varepsilon_4$ (17)

where $\tilde{U}_{OCV}$ and $\varepsilon_4$ respectively represent an error in the OCV value of the battery and an error in the corresponding OCV of the battery when an error exists in the SOC of the battery.

It should be noted that, for different BMS systems, the sampling error factor of the voltage data, the sampling error factor of the current data, and the value of the sampling time difference between the voltage data and the current data may also have differences. In a case that the value of the sampling time difference between the voltage data and the current data cannot be neglected, equations (9), (10), and (14)-(17) are considered $\tilde{Y}=U_{OCV}(k)+U_{hys}(k)-\tilde{U}(k)$ is obtained under the onboard environment. In combination with the discretized expression form of the battery model shown in Equation (8), the following equation may be obtained:

$$Y(k) \approx \sum_{j=1}^{L} a_j \cdot Y(k-j) + \tag{18}$$
$$\left[\left(1 - \sum_{j=1}^{L} a_j\right) \cdot (\varepsilon_4 - \varepsilon_1) - \sum_{i=0}^{L} b_i \cdot \varepsilon_2\right] + \left[b_0 \cdot \left(1 - \frac{\varepsilon_3}{T}\right) \cdot \tilde{I}(k)\right] +$$
$$\sum_{i=1}^{L} \left\{\left[b_i \cdot \left(1 - \frac{\varepsilon_3}{T}\right) + b_{i-1} \cdot \frac{\varepsilon_3}{T}\right] \cdot \tilde{I}(k-i)\right\} + \left[\frac{\varepsilon_3 \cdot b_L}{T} \cdot \tilde{I}(k-L-1)\right]$$

Further, $a_0 = \left[\left(1 - \sum_{j=1}^{L} a_j\right) \cdot (\varepsilon_4 - \varepsilon_1) - \sum_{i=0}^{L} b_j \cdot \varepsilon_2\right]$, $c_1 = \left[b_0 \cdot \left(1 - \frac{\varepsilon_3}{T}\right)\right]$, $c_2 = \frac{\varepsilon_3 \cdot b_L}{T}$, and $d_i = b_i \cdot \left(1 - \frac{\varepsilon_3}{T}\right) + b_{i-1} \cdot \frac{\varepsilon_3}{T}$ are defined.

In this case, the identification form of the RLS prediction model in the present disclosure is:

$$\begin{cases} \varphi(k) = Y(k-1) \sim Y(k-L), \tilde{I}(k), \tilde{I}(k-1) \sim \tilde{I}(k-L), \tilde{I}(k-L-1) \\ \theta(k) = (a_1 \sim a_L, a_0, c_1, d_1 \sim d_L, c_2)^T \end{cases} \tag{19}$$

By adopting the above technical solution, the battery model parameter is inversely solved by using the RLS prediction model, so that the element parameter value in the equivalent circuit model can be determined. In addition, the RLS prediction model further considers the errors in all kinds of data acquired by the sampling device of the BMS. In this way, the impact of the errors (for example, colored measurement noise caused by continuous aging of the sampling device of the BMS, an estimation error in the parameter value of the equivalent circuit model caused by non-synchronization between the current measurement process and the voltage measurement process during the BMS measurement, and the like) in all kinds of data acquired by the sampling device of the BMS on the estimation of the parameter value of the equivalent circuit model can be reduced under a complicated onboard condition, thereby solving the problem of a decrease in the accuracy of estimation of the subsequent battery state.

It should be noted that the above method is described by using, as an example, the error information including the sampling error factor of the voltage data, the sampling error factor of the current data, the sampling time difference between the voltage data and the current data, and the error in the OCV of the battery. However, those skilled in the art should understand that, during specific implementation, the error information may also include one or more of the sampling error factor of the voltage data, the sampling error factor of the current data, the sampling time difference between the voltage data and the current data, or the error in the OCV of the battery. In order to avoid unnecessary repetition, various possible combinations are not described again in the present disclosure.

S13: An estimated value of the SOC of the battery is determined based on the element parameter value in the equivalent circuit model, the state data, and the battery characteristic data according to a technique of an observer.

During specific implementation, when the electric vehicle is powered on, the observer may be initialized according to various conditions for an initial value. For example, a state vector of the battery is initialized.

In step S13, a possible implementation is that the state data further includes temperature data, and the observer is an adaptive unscented Kalman filter (AUKF) observer. Accordingly, the determining an estimated value of the SOC of the battery based on the element parameter value in the equivalent circuit model, the state data, and the battery characteristic data according to a technique of an observer includes the following steps.

S131: A state vector feature point set, a first weight coefficient, and a second weight coefficient are generated according to estimated values of state vectors of a battery at a previous moment and a covariance of the state vectors.

The covariance of the state vectors at the previous moment is calculated according to a process noise variance.

According to some embodiments of the present disclosure, after the electric vehicle is powered on, the AUKF observer is initialized based on a battery off-line test result. In this case, estimated values of the state vectors of the battery and the covariance of the state vectors are obtained through initialization, and the estimated values of the state vectors of the battery and the covariance of the state vectors at other moments are calculated based on the estimated value of the SOC of the battery at the previous moment.

S132: A priori value of a first state vector is calculated based on the element parameter value, the state vector feature point set, and the current data by using a first state equation of a state space equation of the battery.

S133: A measurement correction matrix is determined according to the priori value of the first state vector, a measurement noise variance, the temperature data, the current data, the first weight coefficient, the second weight coefficient, and a second output equation of the state space equation of the battery.

S134: A posteriori value of a second state vector is calculated based on the measurement correction matrix, the priori value of the first state vector, and the voltage data.

S135: The estimated value of the SOC of the battery is determined according to the posteriori value of the second state vector and the state space equation of the battery.

In some embodiments, the initializing the observer according to the various conditions for the initial value further includes initializing the covariance of the state vectors of the battery, the process noise variance, and the measurement noise variance. In addition, a sequence length is set, as shown in the following equation:

$$\begin{cases} X_{joint}(0) = \left[(P_{parameter}0)^T, X_{state}(0)^T\right] \\ P_{joint}(0) = \left[(P_{parameter}0')^T, PX_{state}(0)^T\right] \\ Q(0) = QS \\ R(0) = RS \\ M_{AUKF} = 6 \end{cases} \tag{20}$$

where $X_{joint}(0)$ is an estimated value of the state vector of the battery, $P_{joint}(0)$ is the covariance of the state vectors, $X_{state}(0)$ is an estimated value of the state vector of the battery at a previous moment, $PX_{state}(0)$ is the covariance of the state vectors at the previous moment, T is a sampling interval, $P_{parameter}0$ is an element parameter value, $Q(0)$ is an initialized process noise variance, $R(0)$ is an initialized measurement noise variance, QS and RS are respectively a process noise and a measurement noise, and $M_{AUKF}$ is a sequence length.

For example, the state vector feature point set is generated by symmetric sampling, as shown in the following identification form:

$$
\begin{cases}
X_{joint}^0(k-1) = X_{joint}(k-1) & (21) \\
X_{joint}^i(k-1) = X_{joint}^0(k-1) + \sqrt{(N+\mu)P_{joint}(k-1)}\Big|_i, \ i = 1,2, \ldots, N \\
X_{joint}^{i+N}(k-1) = X_{joint}^0(k-1) - \sqrt{(N+\mu)P_{joint}(k-1)}\Big|_i, \ i = 1,2, \ldots, N
\end{cases}
$$

where $$
x_{joint}^j(k-1)
$$

is a state vector feature point set, $P_{joint}(k-1)$ is the covariance of state vectors at a $(k-1)^{th}$ moment, and N and $\mu$ are respectively a length factor and a scaling factor of the state vector.

Then, a time update is performed on the state vector feature point set by using the first state equation in the state space equation of the battery, so as to obtain the priori value $$
x_{joint}^j(k)
$$

of the first state vector, as shown in Equation (22):

$$
X_{joint}^j(k) = f\left(X_{joint}^j(k-1), P_{parameter}, I(k)\right), \ j = 0, 1, \ldots, 2N \quad (22)
$$

where $$
x_{joint}^j(k)
$$

is a state vector feature point set after a time update is performed on a $j^{th}$ feature point, and $I(k)$ is current data of the battery at the $k^{th}$ moment.

In another example, the first weight coefficient $$
W_{mean}^j(k)
$$

and the second weight coefficient $$
W_{COV}^j(k)
$$

may be calculated by using the following equation:

$$
W_{COV}^j(k) = W_{mean}^j(k) = \frac{1}{2(N+\mu)}, \ j = 1,2 \ldots, 2N
$$

Then a first expectation $$
x_{joint}^{time}(k)
$$

is calculated based on the first weight coefficient $$
W_{mean}^j(k)
$$

and the priori value $$
x_{joint}^j(k)
$$

of the first state vector, as shown in the following identification form:

$$
x_{joint}^{time}(k) = \sum_{j=0}^{2N} W_{mean}^j(k) \cdot x_{joint}^j(k), \ j = 0, 1 \ldots 2N
$$

A difference $$
x_{joint2}^j(k)
$$

between the priori value of the first state vector and the first expectation is calculated by using the following:

$$
x_{joint2}^j(k) = x_{joint}^j(k) - x_{joint}^{time}(k)
$$

For example, the determination of the measurement correction matrix may be in the following identification form. First, an estimated value of a first output $$
Y_{output}^j(k)
$$

of the $j^{th}$ feature point after being measured and updated is calculated by using the state vector feature point set $$
x_{joint}^j(k),
$$

the element parameter value, the current data, and the temperature data. Then a second expectation $$
Y_{output}^{mea}(k)
$$

outputted by the feature point set is calculated by using the first weight coefficient $$
W_{mean}^j(k)
$$

and the estimated value of the first output $$Y_{output}^{j}(k)$$

that are calculated. Finally, a difference between the estimated value of the first output and the second expectation $$Y_{output2}^{j}(k)$$

of the $j^{th}$ feature point is calculated. A first calculation equation of the second output equation of the state space equation of the battery may be expressed as follows:

$$\begin{cases} Y_{output}^{j}(k) = g\left(X_{joint}^{j}(k), P_{parameter}, I(k), Temp(k)\right), j = 0, 1, \ldots, 2N \quad (24) \\ Y_{joint}^{mea}(k) = \sum_{j=0}^{2N} Wt_{mean}^{j}(k) \cdot Y_{output}^{j}(k), j = 0, 1, \ldots, 2N \\ Y_{output2}^{j}(k) = Y_{output}^{j}(k) - Y_{joint}^{mea}(k), j = 0, 1, \ldots, 2N \end{cases}$$

Then the measurement correction matrix is calculated according to the calculated difference $$Y_{output2}^{j}(k)$$

between the estimated value of the first output and the second expectation of the $j^{th}$ feature point, the difference $$X_{joint2}^{j}(k)$$

between the priori value of the first state vector and the first expectation, and the second weight coefficient $$W_{COV}^{j}(k).$$

A second calculation equation of the second output equation of the state space equation of the battery may be expressed as follows:

$$\begin{cases} P_{xy}^{mea}(k) = \sum_{j=0}^{2N} Wt_{cov}^{j}(k) \cdot X_{joint2}^{j}(k) \cdot Y_{output2}^{j}(k)^{T}, \quad (25) \\ \qquad\qquad j = 0, 1, \ldots, 2N \\ P_{y}^{mea}(k) = \sum_{j=0}^{2N} \left(Wt_{cov}^{j}(k) \cdot Y_{output2}^{j}(k) \cdot Y_{output2}^{j}(k)^{T}\right) + \\ \qquad R(k), j = 0, 1, \ldots, 2N \\ K_{joint}(k) = P_{xy}^{mea}(k) \cdot P_{y}^{mea}(k)^{-1} \end{cases}$$

where $$P_{xy}^{mea}(k)$$

and $$P_{y}^{mea}(k)$$

respectively represent a covariance between a state and an output of the feature point set at the $k^{th}$ moment and a variance of the output.

Equations (24) and (25) herein are the second output equations of the state space equation of the battery.

Then the posteriori value of the state vector is calculated based on the measurement correction matrix according to the priori value $$x_{joint}^{time}(k)$$

of the first state vector, the voltage data U(k), and an expected value $$Y_{joint}^{mea}(k)$$

by using the following equation, which is used for determining the estimated value of the SOC of the battery.

$$X_{joint}(k) = X_{joint}^{time}(k) - K_{joint}(k) \cdot \left[U(k) - Y_{joint}^{mea}(k)\right]$$

Finally, the estimated value of the SOC of the battery is calculated according to the posteriori value of the state vector and the space state equation of the battery.

According to some embodiments of the present disclosure, the covariance of the state vectors at the previous moment is calculated according to the process noise variance, including:

calculating a first expectation based on the first weight coefficient and the priori value of the first state vector;

obtaining a priori value of the covariance of the state vectors based on the second weight coefficient, the difference between the priori value of the first state vector and the first expectation, and the process noise variance;

determining an estimated value of a first output according to current data, the temperature data, the measurement noise variance, the element parameter value, and the priori value of the first state vector;

calculating a second expectation based on the first weight coefficient and the estimated value of the first output; and calculating the covariance of the state vectors at the previous moment based on the measurement correction matrix, the priori value of the covariance of the state vectors, and the difference between the estimated value of the first output and the second expectation.

For example, the first expectation $$X_{joint\ 2}^{j}(k)$$

and the priori value $$P_{joint}^{time}(k)$$

of the covariance of the state vectors may be calculated by using the following equation:

$$P_{joint}^{time}(k) = \sum_{j=0}^{2N} \left\{ W_{COV}^j(k) \cdot x_{joint2}^j(k) \cdot \left[ x_{joint2}^j(k) \right]^T + Q(k) \right\}$$

where Q(k) is a process noise variance.

According to some embodiments of the present disclosure, the posteriori value of the covariance of the state vectors is calculated, by using the following equation, based on the measurement correction matrix and the estimated value of the first output calculated in the above example, which is used for determining an estimated value of the SOC of the battery at a next moment.

$$P_{joint}(k) = P_{joint}^{time}(k) - K_{joint}(k) \cdot P_y^{mea}(k) \cdot K_{joint}(k)^T$$

T is a sampling interval.

According to some embodiments of the present disclosure, the process noise variance and the measurement noise variance are determined by:

determining an output residual according to a voltage parameter in the element parameter value and the voltage data;

calculating an output residual matrix according to a first output residual and the output residual in the estimated value of the SOC of the battery that are calculated at the previous moment;

determining a theoretical process noise variance and a theoretical measurement noise variance according to the output residual matrix; and determining the process noise variance and the measurement noise variance based on a noise correction rule according to the theoretical process noise variance and the theoretical measurement noise variance.

For example, the output residual $U_e(k)$ of the model at the current moment may be calculated in combination with the voltage data of the battery based on a voltage output value of a battery model, as shown in Equation (27):

$$U_e(k) = U(k) - Y_{joint}^{mea}(k) \tag{27}$$

In combination with the output residual within the previous moment, the output residual matrix H(k) is calculated by using Equation (28), and the theoretical noise variances $Q_{id}(k)$ and $R_{id}(k)$ are obtained according to Equation (29):

$$H(k) = \begin{cases} \sum_{m=k-M_{AUKF}+1}^{k} U_e(m), & k \geq M_{AUKF} \\ 0, & k < M_{AUKF} \end{cases} \tag{28}$$

$$\begin{cases} Q_{id}(k) = K_{joint}(k) \cdot H(k) \cdot [K_{joint}(k)]^T \\ R_{id}(k) = H(k) - P_y^{mea}(k) + R(k) \end{cases} \tag{29}$$

Based on the noise correction rule, the process noise variance Q(k+1) and the measurement noise variance R(k+1)are calculated, as shown in Equation (30) and Equation (31):

$$Q(k+1) = \begin{cases} Q(k), \ R_{id}(k) \leq \delta \\ Q(k), \ R_{id}(k) > \delta \text{ and trace } (Q(k)) \geq \text{trace } (Q_{id}(k)) \\ Q_{id}(k), \ R_{id}(k) > \delta \text{ and trace } (Q(k)) < \text{trace } (Q_{id}(k)) \end{cases} \tag{30}$$

$$R(k+1) = \begin{cases} R(k), \ R_{id}(k) \leq \delta \\ R(k), \ R_{id}(k) > \delta \text{ and } R(k) \geq R_{id}(k) \\ R_{id}(k), \ R_{id}(k) > \delta \text{ and } R(k) < R_{id}(k) \end{cases} \tag{31}$$

where trace(•) is a trace of the matrix, and $\delta$ is a preset boundary value of the measurement noise variance.

According to some embodiments of the present disclosure, the noise correction rule includes:

using the output residual at the previous moment as the process noise variance and the measurement noise variance when a value of the theoretical measurement noise variance is less than a preset threshold.

According to some embodiments of the present disclosure, after the output residual at the previous moment is used as the process noise variance and the measurement noise variance, the observer is downgraded from an AUKF observer to a UKF observer.

A larger one of an initial value of the process noise variance and a trace of a matrix of the theoretical process noise variance is used as the process noise variance, and a larger one of an initial value of the measurement noise variance and the theoretical measurement noise variance is used as the measurement noise variance, when the value of the theoretical measurement noise variance is not less than the preset threshold.

In step S13, another possible implementation is that the state data further includes temperature data, and the observer is a Luenberger observer. Accordingly, the determining an estimated value of the SOC of the battery based on the element parameter value in the equivalent circuit model, the state data, and the battery characteristic data according to a technique of an observer includes the following steps.

S1301: A priori value of a second state vector is determined according to the estimated values of the state vectors of the battery, the element parameter value, the current data, and a second state equation of a state space equation of the battery.

S1302: An estimated value of a second output is determined according to the priori value of the second state vector, the temperature data, the current data, and the second output equation of the state space equation of the battery.

S1303: A posteriori value of the second state vector is determined according to the estimated value of the second output, the voltage data, and a preset gain of the Luenberger ob server.

S1304: The estimated value of the SOC of the battery is determined according to the posteriori value of the second state vector and the state space equation of the battery.

According to some embodiments of the present disclosure, after the electric vehicle is powered on, the Luenberger observer is initialized based on a battery off-line test result. In this case, estimated values of the state vectors of the battery are obtained through initialization, and the estimated values of the state vectors of the battery at other moments are calculated based on the estimated value of the SOC of the battery at the previous moment.

For example, the expression form of the second state equation of the state space equation of the battery is as follows:

$$x_{joint2}^{time}(k) = f[x_{joint}(k-1), P_{parameter}, I(k)] \tag{32}$$

where $$x_{joint2}^{time}(k)$$

is the priori value of the second state vector, $x_{joint}(k-1)$ is the estimated value of the state vector of the battery at the $(k-1)^{th}$ moment, $P_{parameter}$ is the element parameter value, and $I(k)$ is current data of the battery at the $k^{th}$ moment.

For example, the expression form of the second output equation of the state space equation of the battery is as follows:

$$Y_{joint2}^{mea}(k) = g\left[x_{joint2}^{time}(k), P_{parameter}, I(k), T(k)\right] \tag{33}$$

where $$Y_{joint2}^{time}(k)$$

the estimated value of the second output, and $T(k)$ is temperature data at the $k^{th}$ moment.

For example, the posteriori value of the second state vector may be calculated by using the following equation:

$$x_{joint2}(k) = \tag{34}$$

$$x_{joint2}^{time}(k) + KP_{joint} \cdot \left[U(k) - Y_{joint2}^{mea}(k)\right] + KI_{joint} \cdot \sum_{i=1}^{k}\left[U(i) - Y_{joint2}^{mea}(i)\right]$$

$KP_{joint}$ and $KI_{joint}$ are both preset gains of the Luenberger observer, and $U(k)$ is voltage data at the $k^{th}$ moment.

According to some embodiments of the present disclosure, the state space equation of the battery is:

$$\begin{cases} x(k) = f[x(k-1), p_{parameter}, I(k)] + \omega(k) \\ U(k) = g[x(k), P_{parameter}, I(k), Temp(k)] + \gamma(k) \end{cases}$$

$$\text{where } P_{parameter} = [R_0, R_1 \sim R_L, C_1 \sim C_L]$$

is a column vector of the element parameter value, $R_0$ is an ohmic resistance of the equivalent circuit model, $R_1 \sim R_L$ are polarization resistances of the equivalent circuit model, $C_1 \cdot C_L$ are polarization capacitances of the equivalent circuit model, $U(k)$ and $I(k)$ are respectively the voltage data and the current data at the $k^{th}$ moment, Temp(k) is the temperature data at the $k^{th}$ moment, $\omega(k)$ is the process noise, $\gamma(k)$ is the measurement noise, a variance of the process noise and a variance of the measurement noise are respectively the process noise variance and the measurement noise variance, and $f(\bullet)$ and $g(\bullet)$ are both nonlinear functions.

L-order RC circuits are shown in the following equation:

$$\begin{cases} \begin{bmatrix} SOC(k) \\ U_{R_1C_1}(k) \\ \vdots \\ U_{R_LC_L}(k) \end{bmatrix} = \begin{bmatrix} 1 & 0 & \dots & 0 \\ 0 & e^{-T/R_1C_1} & \dots & 0 \\ 0 & 0 & \ddots & 0 \\ 0 & 0 & \dots & e^{-T/R_lC_L} \end{bmatrix} \cdot \begin{bmatrix} SOC(k-1) \\ U_{R_1C_1}(k-1) \\ \vdots \\ U_{R_LC_L}(k-1) \end{bmatrix} + \begin{bmatrix} -T/C_M \\ R_1 \cdot \left(1 - e^{-T/R_1C_1}\right) \\ \vdots \\ R_L \cdot \left(1 - e^{-T/R_LC_L}\right) \end{bmatrix} \cdot I(k) + \omega(k) \\ U(k) = U_{OCV}(SOC(k), Temp(k)) + U_{hys}(SOC(k), Temp(k)) \\ \qquad + [-1 \dots -1] \begin{bmatrix} U_{R_1C_1}(k) \\ \vdots \\ U_{R_LC_L}(k) \end{bmatrix} + [-R_0] \cdot I(k) + \gamma(k) \end{cases} \tag{35}$$

where $T$ is a sampling interval, and $C_M$ is an available capacity of the battery.

Figure 7:
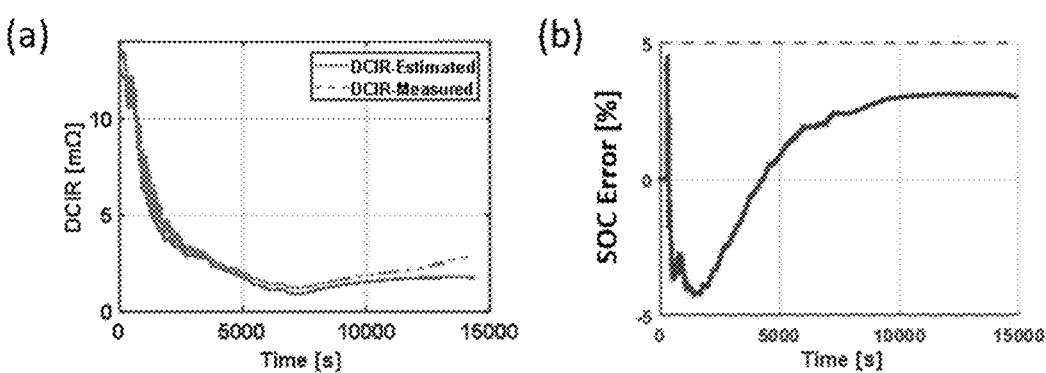
FIG. 7 is an effect diagram of a method for determining an SOC according to an exemplary embodiment of the present disclosure.

The problem of the estimation of the SOC of a ternary lithium-ion battery produced by a certain manufacturer under a dynamic working condition is used as an example. FIG. 6 is an effect diagram of a method for determining an SOC according to an exemplary embodiment of related arts. It can be seen that a maximum value of errors in the SOC is greater than 16%, which is difficult to satisfy the accuracy of 5% required by the BMS standard. FIG. 7 is an effect diagram of a method for determining an SOC according to an exemplary embodiment of the present disclosure. Under the same dynamic working condition, the present disclosure adopts the improved RLS and AUKF for estimation. It can be seen that the errors in the SOC are all less than 5%, which indicates that the accuracy of the present disclosure can satisfy the requirement for the accuracy of the SOC in the BMS standard.

In the above technical solution, the element parameter value in the equivalent circuit model is determined by using the RLS prediction model. In addition, in determining the element parameter value in the equivalent circuit model of the battery, the error information including at least a sampling error factor of the voltage data or a sampling error factor of the current data or the error information of the sampling error factor of the voltage data and the sampling error factor of the current data is further considered. Therefore, the impact of the sampling error may be reduced, accuracy of the element parameter value in the determined equivalent circuit model can be improved, and finally the accuracy of the determined equivalent circuit model of the battery can be improved. According to some embodiments of the present disclosure, the SOC value of the battery is determined based on the technique of the observer, so as to increase a matching degree of the element parameter value and the observer, and improve the estimation accuracy of the SOC, thereby ensuring the efficient management and the reliable operation of the vehicle.

Figure 8:
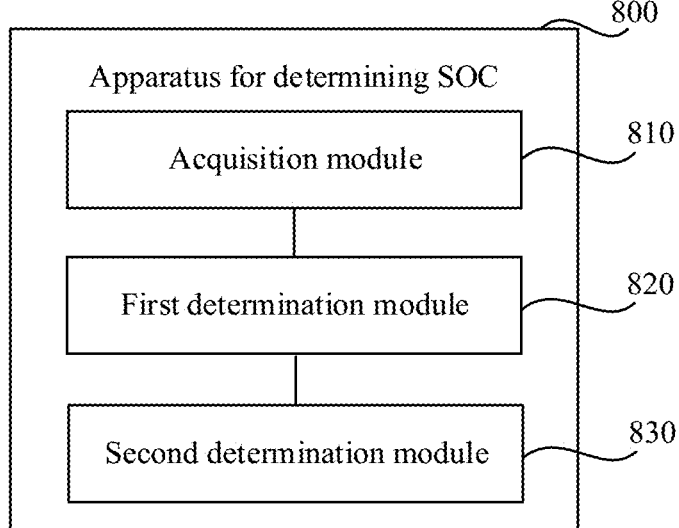
FIG. 8 is a block diagram of an apparatus for determining an equivalent circuit model according to an exemplary embodiment of the present disclosure.

The present disclosure further provides an apparatus for determining an SOC of a battery. Referring to a block diagram of the apparatus for determining an equivalent circuit model shown in FIG. 8, the apparatus 800 includes:

an acquisition module 810, configured to acquire state data of the battery, where the state data includes current data and voltage data;

a first determination module 820, configured to determine each element parameter value in the equivalent circuit model of the battery based on an equivalent circuit model, error information, battery characteristic data, and the state data by using an RLS prediction model; and a second determination module 830, configured to determine an estimated value of the SOC of the battery based on the element parameter value in the equivalent circuit model, the state data, and the battery characteristic data according to a technique of an observer.

According to some embodiments of the present disclosure, a third determination module is configured to determine an order of the equivalent circuit model. The third determination module includes:

an acquisition submodule, configured to obtain initial attribute information of the battery based on an off-line test of the battery, where the initial attribute information includes an OCV-SOC curve and a hysteresis voltage-SOC curve of the battery;

an establishment submodule, configured to establish multiple initial equivalent circuit models of different orders according to the initial attribute information;

a test submodule, configured to test, for the initial equivalent circuit model of each order, calculation error information and calculation time information of the initial equivalent circuit model under a target working condition;

a calculation submodule, configured to calculate a matching degree of each of the initial equivalent circuit models according to a number of parameters, the calculation error information, and the calculation time information of each corresponding initial equivalent circuit model; and a determination submodule, configured to determine, as the equivalent circuit model of the battery, the initial equivalent circuit model having an optimal matching degree.

According to some embodiments of the present disclosure, the equivalent circuit model is an RC circuit. The acquisition module is configured to acquire state data collected by a BMS. The state data further includes temperature data of the battery and SOC data of the battery.

The first determination module includes:

a first determination submodule, configured to determine, according to the SOC data, a target OCV and a target hysteresis voltage from the OCV-SOC curve and the hysteresis voltage-SOC curve of the battery that correspond to the temperature data; and a second determination submodule, configured to determine the element parameter value of the equivalent circuit model of the battery based on the equivalent circuit model, the error information, the current data, the voltage data, the target OCV, and the target hysteresis voltage by using the RLS prediction model.

According to some embodiments of the present disclosure, the error information includes at least one of a sampling error factor of the voltage data, a sampling error factor of the current data, a sampling time difference between the voltage data and the current data, or an error in the OCV of the battery.

According to some embodiments of the present disclosure, the error information includes a sampling error factor of the voltage data, a sampling error factor of the current data, a sampling time difference between the voltage data and the current data, and an error in the OCV of the battery. The identification form of the RLS prediction model is:

$$\begin{cases} \tilde{Y}(k) = \tilde{U}_{OCV}(k) + U_{hys}(k) - \tilde{U}(k) \\ \varphi(k) = \left[ \tilde{Y}(k-1) \sim \tilde{Y}(k-L), 1, \tilde{I}(k), \tilde{I}(k-1) \sim \tilde{I}(k-L), \tilde{I}(k-L-1) \right] \\ \theta(k) = [a_1 \sim a_L, a_0, c_1, d_0 \sim d_L, c_2]^T \\ \tilde{Y}(k) = \varphi(k) \cdot \theta(k) \end{cases}$$

where $\tilde{Y}(k)$ is a measured value of an output signal of the RLS prediction model at a $k^{th}$ moment, $U_{OCV}(k)$ and $U_{hys}(k)$ respectively represent a target OCV and a target hysteresis voltage of the battery at the $k^{th}$ moment, $\tilde{U}(k)$ is a battery voltage value collected by the BMS at the $k^{th}$ moment, $\varphi(k)$ is an input signal of the RLS prediction model at the $k^{th}$ moment, $\tilde{I}(k)$ is a battery current value collected by the BMS at the $k^{th}$ moment, $\theta(k)$ is a parameter matrix of the RLS prediction model at the $k^{th}$ moment, $a_1 \sim a_L$, $a_0$, $c_1$, $d_0 \sim d_L$, $c_2$ are parameters in the parameter matrix, L is an order of the initial equivalent circuit model, and T is a sampling period of the BMS.

$\tilde{U}(k) = U(k) \pm \varepsilon_1$, where $U(k)$ is a truth value of a voltage of the battery at the $k^{th}$ moment, and $\varepsilon_1$ is a sampling error factor of the voltage data. $\tilde{I}(k) = I(k+\varepsilon_3) \pm \varepsilon_2$, where I is a battery current sampled synchronously with the voltage, $\varepsilon_2$ is a sampling error factor of the current data, and $\varepsilon_3$ is a sampling time difference between the current data and the voltage data. $\tilde{U}_{OCV}(k) = U_{OCV}(k) + \varepsilon_4$, where $\tilde{U}_{OCV}$ and $\varepsilon_4$ respectively represent an error in an OCV value of the battery and an error in the corresponding OCV of the battery when an error exists in the SOC of the battery.

According to some embodiments of the present disclosure, the observer is an AUKF observer. Accordingly, the second determination module includes:

a generation submodule, configured to generate a state vector feature point set, a first weight coefficient, and a second weight coefficient according to estimated values of state vectors of the battery at a previous moment and a covariance of the state vectors, where the covariance of the state vectors at the previous moment is calculated according to a process noise variance;

a fourth determination submodule, configured to calculate a priori value of a first state vector based on the element parameter value, the state vector feature point set, and the current data by using a first state equation of a state space equation of the battery;

a fifth determination submodule, configured to determine a measurement correction matrix according to the priori value of the first state vector, a measurement noise variance, the temperature data, the current data, the first weight coefficient, the second weight coefficient, and a second output equation of the state space equation of the battery;

a sixth determination submodule, configured to calculate a posteriori value of a second state vector based on the measurement correction matrix, the priori value of the first state vector, and the voltage data; and a seventh determination submodule, configured to determine the estimated value of the SOC of the battery according to the posteriori value of the second state vector and the state space equation of the battery.

According to some embodiments of the present disclosure, the second determination module further includes:

a first calculation submodule, configured to determine an output residual according to a voltage parameter in the element parameter value and the voltage data;

a second calculation submodule, configured to calculate an output residual matrix according to a first output residual and the output residual in the estimated value of the SOC of the battery that are calculated at the previous moment;

a third output submodule, configured to determine a theoretical process noise variance and a theoretical measurement noise variance according to the output residual matrix; and a fourth output submodule, configured to determine the process noise variance and the measurement noise variance based on a noise correction rule according to the theoretical process noise variance and the theoretical measurement noise variance.

According to some embodiments of the present disclosure, the second determination module further includes:

a first judging submodule, configured to use the output residual at the previous moment as the process noise variance and the measurement noise variance when a value of the theoretical measurement noise variance is less than a preset threshold; and a second judging submodule, configured to use a larger one of an initial value of the process noise variance and a trace of a matrix of the theoretical process noise variance as the process noise variance, and use a larger one of an initial value of the measurement noise variance and the theoretical measurement noise variance as the measurement noise variance, when the value of the theoretical measurement noise variance is not less than the preset threshold.

According to some embodiments of the present disclosure, the observer is a Luenberger observer. Accordingly, the second determination module includes:

a twelfth determination submodule, configured to determine a priori value of a second state vector according to the estimated values of the state vectors of the battery, the element parameter value, the current data, and a second state equation of a state space equation of the battery;

a thirteenth determination submodule, configured to determine an estimated value of a second output according to the priori value of the second state vector, the temperature data, the current data, and the second output equation of the state space equation of the battery;

a fourteenth determination submodule, configured to determine a posteriori value of the second state vector according to the estimated value of the second output, the voltage data, and a preset gain of the Luenberger observer; and a fifteenth determination submodule, configured to determine the estimated value of the SOC of the battery according to the posteriori value of the second state vector and the state space equation of the battery.

According to some embodiments of the present disclosure, the state space equation of the battery is:

$$\begin{cases} x(k) = f[x(k-1), p_{parameter}, I(k)] + \omega(k) \\ U(k) = g[x(k), P_{parameter}, I(k), Temp(k)] + \gamma(k) \end{cases}$$

$$\text{where } P_{parameter} = [R_0, R_1 \sim R_L, C_1 \sim C_L]$$

is a column vector of the element parameter value, $R_0$ is an ohmic resistance of the equivalent circuit model, $R_1 \sim R_L$ are polarization resistances of the equivalent circuit model, $C_1 \sim C_L$ are polarization capacitances of the equivalent circuit model, $U(k)$ and $I(k)$ are respectively the voltage data and the current data at the $k^{th}$ moment, $Temp(k)$ is the temperature data at the $k^{th}$ moment, $\omega(k)$ is the process noise, $\gamma(k)$ is the measurement noise, a variance of the process noise and a variance of the measurement noise are respectively the process noise variance and the measurement noise variance, and $f(\bullet)$ and $g(\bullet)$ are both nonlinear functions.

For the apparatus in the foregoing embodiments, a specific manner in which each module performs an operation is already described in detail in the embodiments related to the method, and details are not described herein again.

In addition, it is to be noted that, for the convenience and brevity of description, the embodiments described in the specification are all preferred embodiments, and the involved parts are not necessarily required for the present disclosure. For example, the first determination module and the second determination module may be mutually independent apparatuses or the same apparatus during specific implementation, which is not limited in the present disclosure.

The present disclosure further provides a computer-readable storage medium, having a computer program stored thereon. The program, when executed by a processor, implements the steps of the method for determining an SOC according to any of the above embodiments.

The present disclosure further provides an electronic device, including: a memory, having a computer program stored thereon; and a processor, configured to execute the computer program in the memory, to implement the steps of the method for determining an SOC according to any of the above embodiments.

Figure 9:
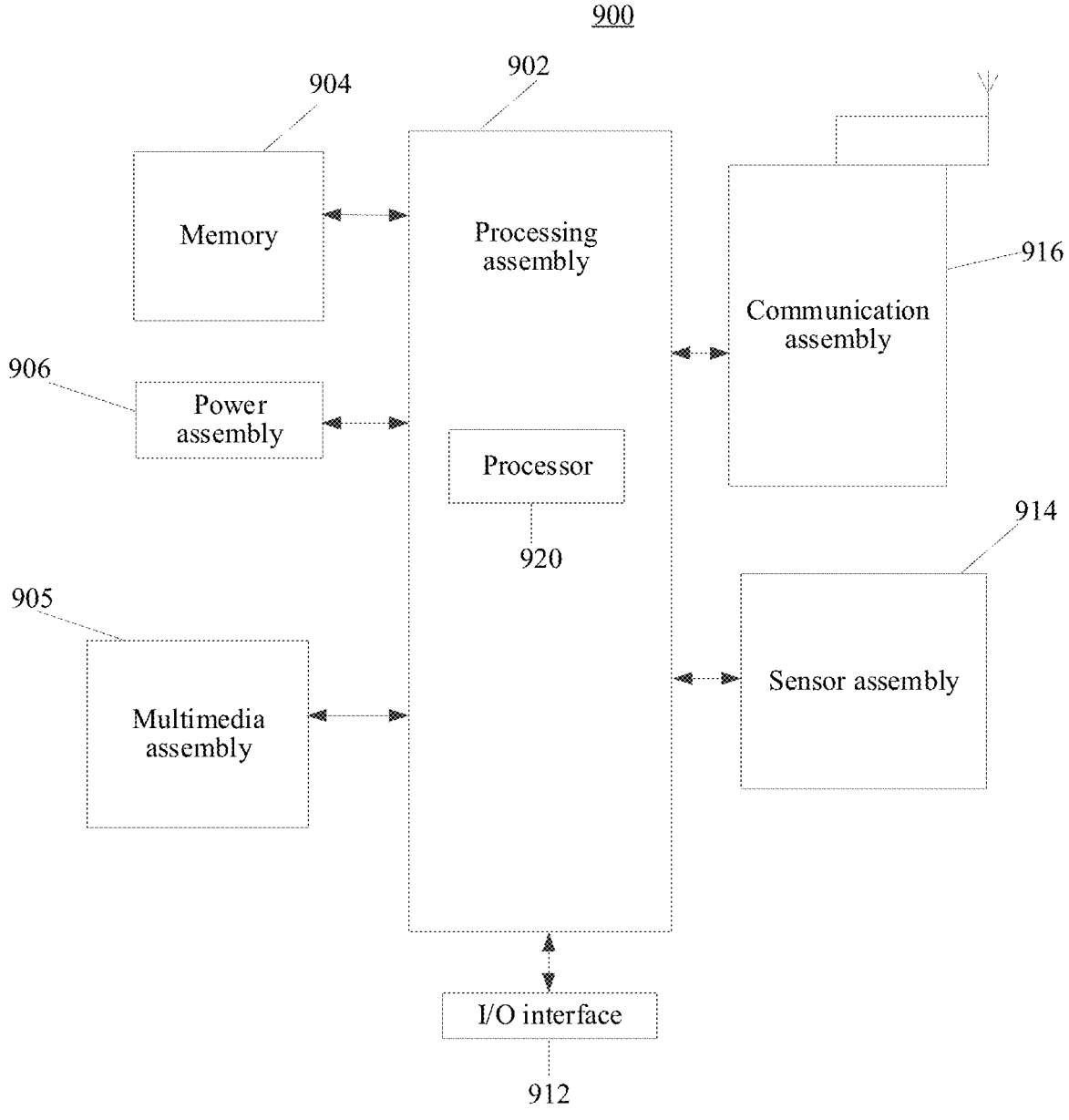
FIG. 9 is a block diagram of an electronic device for determining an equivalent circuit model according to an exemplary embodiment of the present disclosure.

FIG. 9 is a block diagram of an apparatus 900 for determining an equivalent circuit model according to an exemplary embodiment. Referring to FIG. 9, the apparatus 900 may include one or more of the following assemblies: a processing assembly 902, a memory 904, a power assembly 906, a multimedia assembly 905, an input/output (I/O) interface 912, a sensor assembly 914, and a communication assembly 916.

The processing assembly 902 is generally configured to control an overall operation of the apparatus 900, such as acquisition of data, processing of sensor data, solving of an RLS algorithm, and the like. The processing assembly 902 may include one or more processors 920 to execute instructions, to perform all or some of the steps of the above method for determining an SOC. In addition, the processing assembly 902 may include one or more modules, to facilitate the interaction between the processing assembly 902 and other assemblies. For example, the processing assembly 902 may include a multimedia module, to facilitate the interaction between the multimedia assembly 905 and the processing assembly 902.

The memory 904 is configured to store various types of data to support operations on the apparatus 900. Examples of such data include instructions for any application or method operating on the apparatus 900, historical current data, historical voltage data, an OCV-SOC curve and a hysteresis voltage-SOC curve of a battery, and the like. The memory 904 can be implemented by any type of volatile or non-volatile storage devices or a combination thereof, such as a static random access memory (SRAM), an electrically erasable programmable read-only memory (EEPROM), an erasable programmable read-only memory (EPROM), a programmable read-only memory (PROM), a read-only memory (ROM), a magnetic memory, a flash memory, a magnetic disk, or an optical disc.

The power assembly 906 provides power to various assemblies of the apparatus 900. The power assembly 906 may include a power supply management system, one or more power supplies, and other assemblies associated with generating, managing and allocating power for the apparatus 900.

The multimedia assembly 905 includes a screen providing an output interface between the apparatus 900 and a user. In some embodiments, the screen may include a liquid crystal display (LCD) and a touch panel (TP). If the screen includes a touch panel, the screen may be implemented as a touch-screen to receive an input signal from the user. The touch panel includes one or more touch sensors to sense touching, sliding, and gestures on the touch panel. The touch sensor may not only sense the boundary of touching or sliding operations, but also detect duration and pressure related to the touching or sliding operations.

The I/O interface 912 provides an interface between the processing assembly 902 and an external interface module. The external interface module may be a click wheel, buttons, or the like.

The sensor assembly 914 includes one or more sensors configured to provide state assessment of various aspects of the apparatus 900. For example, the sensor assembly 914 may detect a temperature, a current, and the like of the battery. In some embodiments, the sensor assembly 914 may include, for example, a temperature sensor, a speed sensor, a current sensor, and the like.

The communication assembly 916 is configured to facilitate communication in a wired or wireless manner between the apparatus 900 and other devices. The apparatus 900 may access a wireless network based on communication standards, such as Wi-Fi, 2G, or 3G, or a combination thereof.

In an exemplary embodiment, the apparatus 900 can be implemented as one or more application specific integrated circuit (ASIC), a digital signal processor (DSP), a digital signal processing device (DSPD), a programmable logic device (PLD), a field programmable gate array (FPGA), a controller, a micro-controller, a microprocessor or other electronic element, so as to perform the foregoing method for determining an SOC.

In an exemplary embodiment, a non-transitory computer-readable storage medium including instructions, for example, a memory 904 including instructions, is further provided, and the foregoing instructions may be executed by a processor 920 of the apparatus 900 to complete the foregoing method for determining an SOC. For example, the non-transitory computer-readable storage medium may be a ROM, a RAM, a CD-ROM, a magnetic tape, a floppy disk, an optical data storage device, or the like.

In another exemplary embodiment, a computer program product is further provided. The computer program product includes a computer program executable by a programmable apparatus. The computer program, when executed by the programmable apparatus, has a code part configured to perform the above method for determining an SOC.

The present disclosure further provides a BMS. The BMS includes the apparatus for determining an SOC according to any of the above.

For the battery management system in the foregoing embodiments, a specific manner in which each apparatus performs an operation is already described in detail in the embodiments related to the method, and details are not described herein again.

The preferred implementations of the present disclosure are described in detail above with reference to the accompanying drawings. However, the present disclosure is not limited to the specific details in the foregoing implementations, a plurality of simple deformations may be made to the technical solution of the present disclosure within a range of the technical concept of the present disclosure, and these simple deformations fall within the protection scope of the present disclosure.

It should be additionally noted that, the specific technical features described in the foregoing specific implementations may be combined in any proper manner in a case without conflict. To avoid unnecessary repetition, various possible combinations are not further described in the present disclosure.

In addition, the various embodiments of the present disclosure may be combined without departing from the idea of the present disclosure, and such combinations shall also fall within the scope of the present disclosure.

What is claimed is:

1. A method for determining a state of charge (SOC) of a battery, comprising:

Acquiring, by a battery management system (BMS,) state data of the battery, wherein the state data comprises temperature data, SOC data, current data and voltage data;

determining each element parameter value in an equivalent circuit model of the battery based on the equivalent circuit model, error information, battery characteristic data, and the state data by using a recursive least square (RLS) prediction model, wherein the equivalent circuit model is an RC circuit model; the determining each element parameter value in an equivalent circuit model of the battery based on the equivalent circuit model, error information, battery characteristic data, and the state data by using a recursive least square (RLS) prediction model comprises:

determining, according to the SOC data, a target OCV and a target hysteresis voltage from the OCV-SOC curve and the hysteresis voltage-SOC curve of the battery that correspond to the temperature data; and determining the element parameter value of the equivalent circuit model of the battery based on the equivalent circuit model, the error information, the current data, the voltage data, the target OCV, and the target hysteresis voltage by using the RLS prediction model; and determining an estimated value of the SOC of the battery based on the element parameter value in the equivalent circuit model, the state data, and the battery characteristic data by applying an adaptive unscented Kalman filter (AUKF) observer; the determining an estimated value of the SOC of the battery based on the element parameter value in the equivalent circuit model, the state data, and the battery characteristic data according to a technique of an observer comprises:

generating a state vector feature point set, a first weight coefficient, and a second weight coefficient according to estimated values of state vectors of the battery at a previous moment and a covariance of the state vectors, wherein the covariance of the state vectors at the previous moment is calculated according to a process noise variance;

calculating a priori value of a first state vector based on the element parameter value, the state vector feature point set, and the current data by using a first state equation of a state space equation of the battery;

determining a measurement correction matrix according to the priori value of the first state vector, a measurement noise variance, the temperature data, the current data, the first weight coefficient, the second weight coefficient, and a second output equation of the state space equation of the battery;

calculating a posteriori value of a second state vector based on the measurement correction matrix, the priori value of the first state vector, and the voltage data; and determining the estimated value of the SOC of the battery according to the posteriori value of the second state vector and the state space equation of the battery, wherein the process noise variance and the measurement noise variance are determined by:

determining an output residual according to a voltage parameter in the element parameter value and the voltage data;

calculating an output residual matrix according to a first output residual and the output residual in the estimated value of the SOC of the battery that are calculated at the previous moment;

determining a theoretical process noise variance and a theoretical measurement noise variance according to the output residual matrix; and determining the process noise variance and the measurement noise variance based on a noise correction rule according to the theoretical process noise variance and the theoretical measurement noise variance, wherein the noise correction rule comprises:

using the output residual at the previous moment as the process noise variance and the measurement noise variance when a value of the theoretical measurement noise variance is less than a preset threshold; and using a larger one of an initial value of the process noise variance and a trace of a matrix of the theoretical process noise variance as the process noise variance, and using a larger one of an initial value of the measurement noise variance and the theoretical measurement noise variance as the measurement noise variance, when the value of the theoretical measurement noise variance is not less than the preset threshold.

2. The method according to claim 1, wherein the equivalent circuit model is determined by:

obtaining initial attribute information of the battery based on an off-line test of the battery, wherein the initial attribute information comprises an open circuit voltage (OCV)-SOC curve and a hysteresis voltage-SOC curve of the battery;

establishing a plurality of initial equivalent circuit models of different orders according to the initial attribute information;

testing, for the initial equivalent circuit model of each order, calculation error information and calculation time information of the initial equivalent circuit model under a target working condition;

calculating a matching degree of each of the initial equivalent circuit models according to a number of parameters, the calculation error information, and the calculation time information of each corresponding initial equivalent circuit model; and determining, as the equivalent circuit model of the battery, the initial equivalent circuit model having an optimal matching degree.

3. The method according to claim 1, wherein the error information comprises at least one of a sampling error factor of the voltage data, a sampling error factor of the current data, a sampling time difference between the voltage data and the current data, or an error in the OCV of the battery.

4. The method according to claim 1, wherein the error information comprises a sampling error factor of the voltage data, a sampling error factor of the current data, a sampling time difference between the voltage data and the current data, or an error in the OCV of the battery; an identification form of the RLS prediction model is:

$$\begin{cases} \tilde{Y}(k) = \tilde{U}_{OCV}(k) + U_{hys}(k) - \tilde{U}(k) \\ \varphi(k) = \left[ \tilde{Y}(k-1) \sim \tilde{Y}(k-L),\, 1,\, \tilde{I}(k),\, \tilde{I}(k-1) \sim \tilde{I}(k-L),\, \tilde{I}(k-L-1) \right] \\ \theta(k) = [a_1 \sim a_L,\, a_0,\, c_1,\, d_0 \sim d_L,\, c_2]^T \\ \tilde{Y}(k) = \varphi(k) \cdot \theta(k) \end{cases}$$

wherein $\tilde{Y}(k)$ is a measured value of an output signal of the RLS prediction model at a $k^{th}$ moment; $U_{ocv}(k)$ and $U_{hys}(k)$ respectively represent a target OCV and a target hysteresis voltage of the battery at the $k^{th}$ moment; U (k) is a battery voltage value collected by the BMS at the $k^{th}$ moment; $\Phi(k)$ is an input signal of the RLS prediction model at the $k^{th}$ moment; I (k) is a battery current value collected by the BMS at the $k^{th}$ moment; $\theta(k)$ is a parameter matrix of the RLS prediction model at the $k^{th}$ moment; $a_1 \sim a_L$, $a_0$, $c_1$, $d_0 \sim d_L$, $c_2$ are parameters in the parameter matrix; L is an order of the initial equivalent circuit model; and T is a sampling period of the BMS;

$\tilde{U}(k) = U(k) \pm \varepsilon_1$; U(k) is a truth value of a voltage of the battery at the $k^{th}$ moment; $\varepsilon_1$ is a sampling error factor of the voltage data; $I(k) = I(k+\varepsilon_3) \pm \varepsilon_2$; I is a battery current sampled synchronously with the voltage; $\varepsilon_2$ is a sampling error factor of the current data; $\varepsilon_3$ is a sampling time difference between the current data and the voltage data; $\tilde{U}_{OCV}(k) = U_{OCV}(k) + \varepsilon_4$; and $\tilde{U}_{OCV}$ and $\varepsilon_4$ respectively represent an error in an OCV value of the battery and an error in the corresponding OCV of the battery when an error exists in the SOC of the battery.

5. The method according to claim 1, wherein the state data further comprises the temperature data; the observer is a Luenberger observer; the determining an estimated value of the SOC of the battery based on the element parameter value in the equivalent circuit model, the state data, and the battery characteristic data according to a technique of an observer comprises:

determining a priori value of a second state vector according to the estimated values of the state vectors of the battery, the element parameter value, the current data, and a second state equation of a state space equation of the battery;

determining an estimated value of a second output according to the priori value of the second state vector, the temperature data, the current data, and the second output equation of the state space equation of the battery;

determining a posteriori value of the second state vector according to the estimated value of the second output, the voltage data, and a preset gain of the Luenberger observer; and determining the estimated value of the SOC of the battery according to the posteriori value of the second state vector and the state space equation of the battery.

6. The method according to claim 1, wherein the state space equation of the battery is:

$$\begin{cases} x(k) = f[x(k-1),\, p_{parameter},\, I(k)] + \omega(k) \\ U(k) = g[x(k),\, P_{parameter},\, I(k),\, Temp(k)] + \gamma(k) \end{cases}$$

$$P_{parameter} = [R_0,\, R_1 \sim R_L,\, C_1 \sim C_L]$$

is a column vector of the element parameter value; $R_0$ is an ohmic resistance of the equivalent circuit model; $R_1 \sim R_L$ are polarization resistances of the equivalent circuit model; $C_1 \sim C_L$ are polarization capacitances of the equivalent circuit model;

U(k) and I(k) are respectively the voltage data and the current data at the $k^{th}$ moment; Temp(k) is the temperature data at the $k^{th}$ moment; $\omega$(k) is the process noise; Y(k) is the measurement noise; a variance of the process noise and a variance of the measurement noise are respectively the process noise variance and the measurement noise variance; and f(•) and g(•) are both nonlinear functions.

7. An apparatus for determining a state of charge (SOC) of a battery, comprising:

an acquisition module, configured to acquire state data of the battery collected by a battery management system (BMS), wherein the state data comprises temperature data, SOC data, current data and voltage data;

a first determination module, configured to determine each element parameter value in an equivalent circuit model of the battery based on the equivalent circuit model, error information, battery characteristic data, and the state data by using a recursive least square (RLS) prediction model, wherein the equivalent circuit model is an RC circuit model; the first determination module is future configured to determine, according to the SOC data, a target OCV and a target hysteresis voltage from the OCV-SOC curve and the hysteresis voltage-SOC curve of the battery that correspond to the temperature data; and to determine the element parameter value of the equivalent circuit model of the battery based on the equivalent circuit model, the error information, the current data, the voltage data, the target OCV, and the target hysteresis voltage by using the RLS prediction model; and a second determination module, configured to determine an estimated value of the SOC of the battery based on the element parameter value in the equivalent circuit model, the state data, and the battery characteristic data by applying an adaptive unscented Kalman filter (AUKF) observer executed by a battery BMS, wherein the second determination module is further configured to:

generate a state vector feature point set, a first weight coefficient, and a second weight coefficient according to estimated values of state vectors of the battery at a previous moment and a covariance of the state vectors, wherein the covariance of the state vectors at the previous moment is calculated according to a process noise variance;

calculate a priori value of a first state vector based on the element parameter value, the state vector feature point set, and the current data by using a first state equation of a state space equation of the battery;

determine a measurement correction matrix according to the priori value of the first state vector, a measurement noise variance, the temperature data, the current data, the first weight coefficient, the second weight coefficient, and a second output equation of the state space equation of the battery;

calculate a posteriori value of a second state vector based on the measurement correction matrix, the priori value of the first state vector, and the voltage data; and determine the estimated value of the SOC of the battery according to the posteriori value of the second state vector and the state space equation of the battery, and wherein the process noise variance and the measurement noise variance are determined by:

determining an output residual according to a voltage parameter in the element parameter value and the voltage data;

calculating an output residual matrix according to a first output residual and the output residual in the estimated value of the SOC of the battery that are calculated at the previous moment;

determining a theoretical process noise variance and a theoretical measurement noise variance according to the output residual matrix; and determining the process noise variance and the measurement noise variance based on a noise correction rule according to the theoretical process noise variance and the theoretical measurement noise variance, wherein the noise correction rule comprises:

using the output residual at the previous moment as the process noise variance and the measurement noise variance when a value of the theoretical measurement noise variance is less than a preset threshold; and using a larger one of an initial value of the process noise variance and a trace of a matrix of the theoretical process noise variance as the process noise variance, and using a larger one of an initial value of the measurement noise variance and the theoretical measurement noise variance as the measurement noise variance, when the value of the theoretical measurement noise variance is not less than the preset threshold.

8. A battery management system, comprising the apparatus for determining a state of charge (SOC) according to claim 7.

* * * * *